US008969975B2

(12) United States Patent
Takaishi

(10) Patent No.: US 8,969,975 B2
(45) Date of Patent: Mar. 3, 2015

(54) SEMICONDUCTOR DEVICE HAVING SEMICONDUCTOR PILLAR

(71) Applicant: Elpida Memory, Inc., Tokyo (JP)

(72) Inventor: Yoshihiro Takaishi, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 31 days.

(21) Appl. No.: 13/951,982

(22) Filed: Jul. 26, 2013

(65) Prior Publication Data

US 2014/0042555 A1    Feb. 13, 2014

(30) Foreign Application Priority Data

Aug. 8, 2012   (JP) .................. 2012-176168

(51) Int. Cl.
  *H01L 27/088*   (2006.01)
  *H01L 29/78*    (2006.01)
(52) U.S. Cl.
  CPC ..................... *H01L 29/78* (2013.01)
  USPC ....................................................... 257/401
(58) Field of Classification Search
  CPC ................................................ H01L 21/76283
  See application file for complete search history.

(56) References Cited

U.S. PATENT DOCUMENTS

| 8,278,694 | B2 * | 10/2012 | Ikebuchi et al. | 257/306 |
| 8,421,146 | B2 * | 4/2013 | Nojima | 257/329 |
| 8,633,538 | B2 * | 1/2014 | Hayano | 257/328 |
| 8,729,626 | B2 * | 5/2014 | Kosuge et al. | 257/329 |
| 2009/0085102 | A1 | 4/2009 | Takaishi | |
| 2011/0012193 | A1 | 1/2011 | Nojima | |

FOREIGN PATENT DOCUMENTS

| JP | 2009-081389 | 4/2009 |
| JP | 2011-023483 | 2/2011 |

* cited by examiner

*Primary Examiner* — Lex Malsawma
(74) *Attorney, Agent, or Firm* — Young & Thompson

(57) ABSTRACT

Disclosed herein is a device that includes: a semiconductor substrate including an active region having a semiconductor pillar, the semiconductor pillar having first and second side surfaces substantially perpendicular to a main surface of the semiconductor substrate; an element isolation region surrounding the active region, the element isolation region including a first insulating pillar that is in contact with the first side surface of the semiconductor pillar; a gate electrode that covers the second side surface of the semiconductor pillar with an intervention of a gate insulating film; a first impurity diffusion layer formed on an upper surface of the semiconductor pillar; a second impurity diffusion layer formed in the active region located below the semiconductor pillar; and an etching protection wall that is arranged to surround the semiconductor pillar.

6 Claims, 27 Drawing Sheets

SEMICONDUCTOR DEVICE HAVING SEMICONDUCTOR PILLAR

BACKGROUND OF THE INVENTION

1. Field of the Invention

The present invention relates to a semiconductor device and a method for manufacturing the same, and more particularly to a semiconductor device that includes a transistor having a pillar structure and a method for manufacturing the same.

2. Description of Related Art

Recent semiconductor devices employ vertical transistors for higher integration. A vertical transistor includes a gate insulating film and a gate electrode which cover a side surface of a semiconductor pillar erected on a semiconductor substrate. Such components constitute a unit transistor having diffusion layers provided on both sides in a vertical direction of the semiconductor pillar. For example, Japanese Patent Application Laid-open No. 2011-23483 describes a vertical transistor that employs the structure that a gate electrode surrounds a composite pillar including a semiconductor pillar and an insulating pillar. Japanese Patent Application Laid-open No. 2009-81389 describes a step of removing a mask film from discrete pillars. The discrete pillars provides shielding from the surroundings.

In this type of conventional vertical transistor, when a contact plug that feeds power to a gate electrode is provided in a position that is overlapped with a diffusion layer provided under a semiconductor pillar in a plan view, if a displacement occurs, the contact plug reaches the diffusion layer and is then short-circuited. Accordingly, it is advantageous to provide the contact plug in a position that is overlapped with an element isolation region. Therefore, an insulating pillar provided in the element isolation region contacts the semiconductor pillar, and the gate electrode provided on a side surface of the semiconductor pillar is extended to the element isolation region.

The composite pillar formed by integrating the semiconductor pillar and the insulating pillar has the advantage that the contact plug that feeds power to the gate electrode can be located above a shallow trench isolation (STI), whereby a penetration short circuit to the semiconductor substrate can be avoided during the formation of the contact hole. The pillars are formed by using a mask film made of a silicon nitride film (SiN). The composite pillar makes it difficult to partly remove only the mask film on the semiconductor pillar, and the etchant can even spread over the mask film on the insulating pillar and unevenly etch the mask film. This makes it difficult to control the shape of the mask pattern.

The semiconductor pillar of the vertical transistor is formed to adjoin the insulating pillar which is a part of the element isolation region. The mask film used to form the pillars remains integrally on the upper surfaces of the respective pillars. Since the presence of the mask film can obstruct the formation of the diffusion layer in an upper portion of the semiconductor pillar, the mask film is removed by wet etching. The etching solution may sometimes flow out of the area of the semiconductor pillar and dissolve the mask film that is supposed to be left. The disappearance of the mask film can cause shape defects such as wiring disconnection and a short circuit in subsequent steps, with the problem of unstable operation of the vertical transistor.

FIG. 26 is a schematic plan view of a semiconductor device 300 before the removal of the mask film according to a related art. FIG. 27 is a schematic plan view of the semiconductor device 300 after the removal of the mask film according to the related art.

As shown in FIG. 26, an STI 2 serving as an element isolation region is provided on a silicon substrate 1 so as to surround an active region 1a. To form a silicon pillar (semiconductor pillar) 5, a mask film 4 made of a silicon nitride film is integrally arranged on the upper surfaces of the STI 2 and the silicon pillar 5. By using the mask film 4 as a mask, dry etching is performed to form two grooves 4A and 4B (hollow portions in the diagram). This also forms the silicon pillar 5 in the active region 1a between the grooves 4A and 4B. Insulating pillars 45, a part of the STI 2, are formed in the element isolation region between the grooves 4A and 4B.

As described above, the mask film 4 arranged on the upper surface of the silicon pillar 5 needs to be removed by wet etching. A mask film 13 made of a silicon dioxide film is arranged on the upper surface of the mask film 4 so that only the mask film 4 on the silicon pillar 5 is exposed through an opening 13a of the mask film 13. Such a nitride film removal step needs a high etching selectivity to the oxide film. Dry etching is not usable because it is difficult to etch the silicon nitride film with high selectivity to the silicon dioxide film. Wet etching capable of highly selective etching is thus used. Note that FIG. 26 shows the mask film 13 as a transparent film in order to clarify the arrangement of the underlying layers. The same applies to FIG. 27.

Next, turning to FIG. 27, the mask film 4 is selectively removed by wet etching, whereby the upper surface of the silicon pillar 5 is exposed. However, since an overetching condition is employed to completely remove the mask film 4 on the silicon pillar 5, the etchant laterally spreads out from the opening 13a of the mask film 13 to the STI 2 side as shown by the arrows, whereby a part of the mask film 4 covering the upper surfaces of the insulating pillars 45 is removed as well. The flow of the wet etching solution into the element isolation region covered by the mask film 13 causes the problem that the amount of the mask film 4 remaining on the upper surfaces of the insulating pillars 45 becomes unstable and the needed mask film 4 can also be removed.

SUMMARY

In one embodiment, there is provided a method for manufacturing a semiconductor device that includes: forming a semiconductor pillar in an active region of a semiconductor substrate and an insulating pillar in an element isolation region surrounding the active region, the semiconductor pillar having first and second side surfaces substantially perpendicular to a main surface of the semiconductor substrate and an upper surface substantially parallel to the main surface of the semiconductor substrate, the insulating pillar being in contact with the first side surface of the semiconductor pillar, the upper surface of the semiconductor substrate being covered with a first mask film; forming a gate electrode that covers the second side surface of the semiconductor pillar with an intervention of a gate insulating film; forming a first impurity diffusion layer in the active region located below the semiconductor pillar; forming an interlayer insulating film that covers at least the gate electrode; and exposing the upper surface of the semiconductor pillar by selectively removing the first mask film by wet etching with the first mask film surrounded by an etching protection wall made of a material different from that of the first mask film.

In a method for manufacturing a semiconductor device according to a first aspect of the present invention, an embedded insulating film for forming an STI is left up to the position of the upper surface of a mask insulating film. The embedded insulating film is processed to obtain the insulating pillar. By using the insulating pillar as the etching protection wall, only the mask film on the semiconductor pillar is selectively removed. In a method for manufacturing a semiconductor device according to a second aspect of the present invention, a groove of closed loop shape surrounding the active region is formed in an outermost peripheral position of the composite pillar. The interlayer insulating film embedded in the groove is used as the etching protection wall, whereby the etchant is prevented from spreading out beyond the etching protection wall.

In one embodiment, there is provided a semiconductor device that includes: a semiconductor substrate including an active region having a semiconductor pillar, the semiconductor pillar having first and second side surfaces substantially perpendicular to a main surface of the semiconductor substrate; an element isolation region surrounding the active region, the element isolation region including a first insulating pillar that is in contact with the first side surface of the semiconductor pillar; a gate electrode that covers the second side surface of the semiconductor pillar with an intervention of a gate insulating film; a first impurity diffusion layer formed on an upper surface of the semiconductor pillar; a second impurity diffusion layer formed in the active region located below the semiconductor pillar; and an etching protection wall that is arranged to surround the semiconductor pillar.

According to the present invention, the etching protection wall can prevent the etchant from spreading out, whereby the remaining mask film can be prevented from disappearing.

DETAILED DESCRIPTION OF THE EMBODIMENTS

Figure 1A:
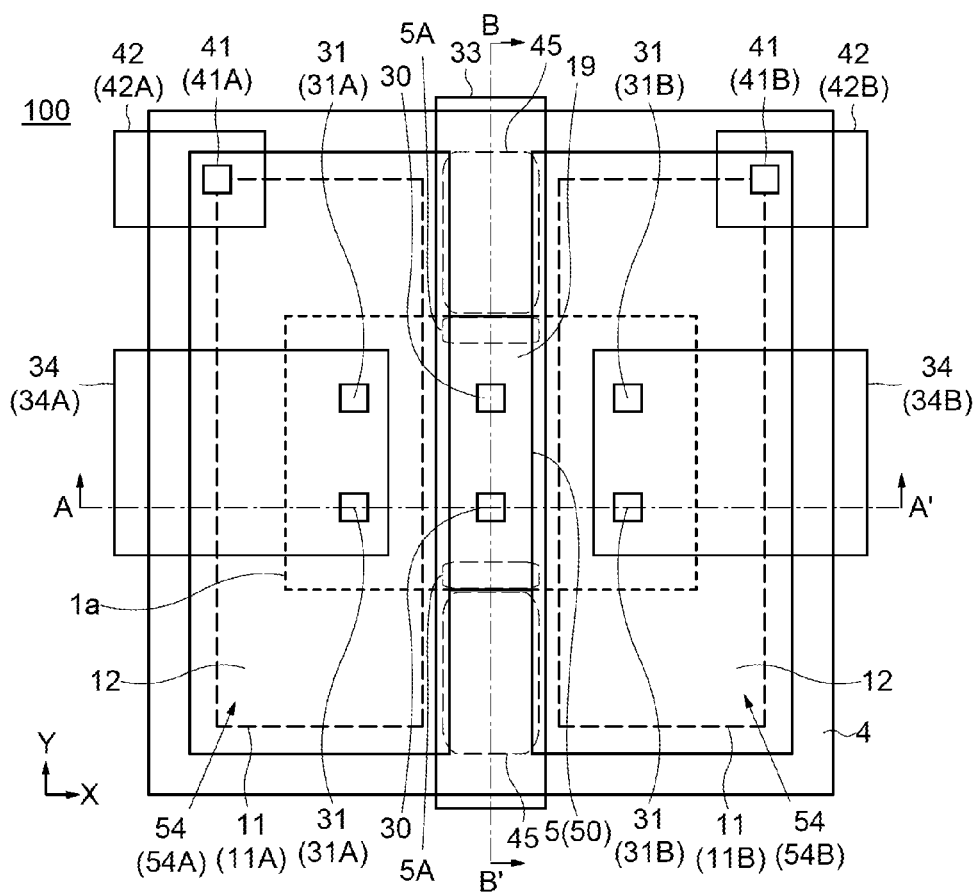
FIG. 1A is a schematic plan view showing a configuration of a semiconductor device according to a first embodiment of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Preferred embodiments of the present invention are explained below in detail with reference to the accompanying drawings. In the drawings explained below, configurations, sizes, and the number of constituent elements are different from those of actual products for easier understanding of these elements. In the following embodiments, an X-Y-Z coordinate system is set and the arrangement of respective configurations is described. In this coordinate system, a Z direction is a direction vertical to a surface of a silicon substrate, a Y direction as a first direction is a direction orthogonal to the Z direction, and an X direction as a second direction is a direction orthogonal to the Y direction in a horizontal surface to a surface of the silicon substrate.

First, a semiconductor device 100 is described with reference to FIGS. 1A, 1B and 2. Incidentally, in FIG. 1A, for making arrangement conditions of respective constituent elements clear, wires located on an interlayer insulating film and contact plugs are illustrated in a transparent manner and only an outline thereof is shown.

Figure 1B:
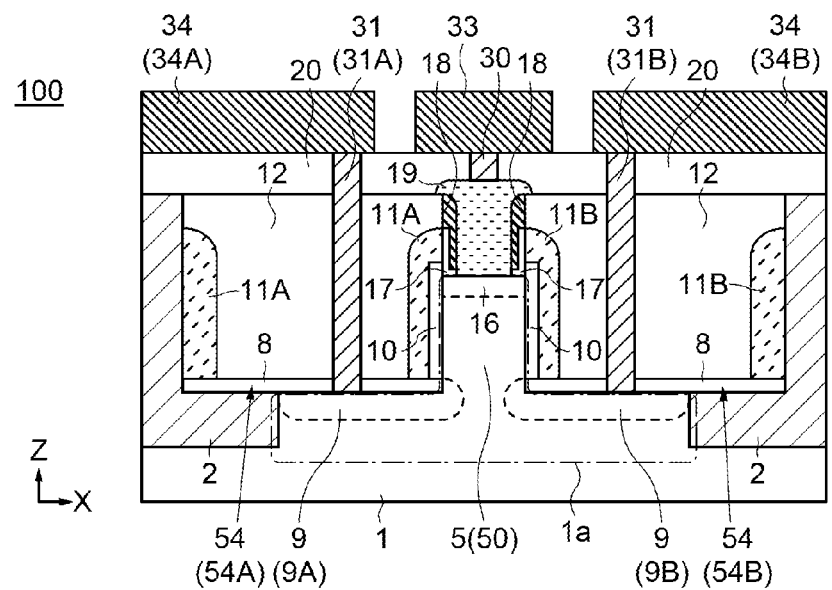
FIG. 1B is a schematic cross-sectional view taken along a line A-A' of FIG. 1A.
Figure 2:
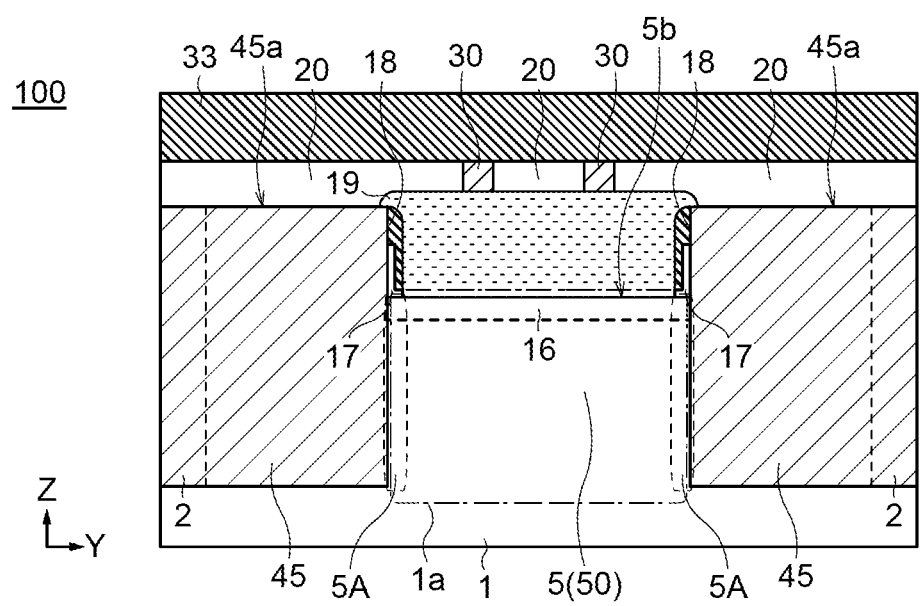
FIG. 2 is a schematic cross-sectional view taken along a line B-B' of FIG. 1A.

As shown in FIGS. 1B and 2, the semiconductor device 100 according to the first embodiment includes a silicon substrate 1 as a representative semiconductor substrate. On an upper surface of the silicon substrate 1, an STI (Shallow Trench Isolation) 2 as an element isolation region is provided. A bottom surface and side surface of a lower part of the STI 2 contact the silicon substrate 1, and the silicon substrate 1 surrounded by the side surface of the lower part of the STI 2 is an active region 1a.

In a central part in the X direction of the active region 1a surrounded by the STI 2, one silicon pillar (semiconductor pillar) 5 is provided. The silicon pillar 5 is provided by arranging grooves (openings) 54 (54A and 54B) at two ends in the X direction of the active region 1a. The silicon pillar 5 is a pillar semiconductor layer constituting a channel region of a unit transistor 50.

Ends 5A in the Y direction of the silicon pillar 5 respectively contact insulating pillars 45 that are integrated with the STI 2, and upper surfaces 45a of the insulating pillars 45 are higher than an upper surface of the silicon pillar 5. Similarly to the silicon pillar 5, the insulating pillars 45 are provided by arranging the grooves (openings) 54 in the STI 2 as the element isolation region. In addition, next to the silicon pillar 5 and the insulating pillars 45, the groove (opening) 54A arranged on the left side in the X direction is respectively arranged integrally, so as to span the element isolation region and the active region 1a. The groove (opening) 54B arranged on the right side has the same configuration. The two insulating pillars 45 arranged continuously to the respective ends of the silicon pillar 5 in the Y direction are thus made of a part of the STI 2.

In an upper end and a lower part of the silicon pillar in the Z direction, impurity diffusion layers are respectively provided. A pillar upper diffusion layer 16 (second impurity diffusion layer) located in the upper end of the silicon pillar 5 is a diffusion layer as one source/drain region. A pillar lower diffusion layers 9 (first impurity diffusion layer) located in the lower part of the silicon pillar 5 are diffusion layers as the other source/drain region. A region of the silicon pillar 5 interposed between the pillar upper diffusion layer 16 and the pillar lower diffusion layer 9 functions as a channel region. In the first embodiment, the pillar lower diffusion layers 9 are provided over the entire surfaces of the active region 1a lying both on the right and left of the silicon pillar 5 in the X direction, and the diffusion layer on the left side is called "pillar lower diffusion layer 9A" and the diffusion layer on the right side is called "pillar lower diffusion layer 9B".

Insulating films 8 are provided on the upper surfaces of the active region 1a that lie on the right and left of the silicon pillar 5 and constitute the bottom surfaces of the openings 54. The insulating films 8 cover the upper surfaces of the active region 1a other than the silicon pillar 5, and reach the STI 2. The pillar lower diffusion layers 9 are arranged under the insulating films 8 so as to overlap the insulating films 8. The bottom surfaces of the pillar lower diffusion layers 9 are provided to be shallower than the bottom surface of the STI 2, which prevents electrical conduction between pillar lower diffusion layers 9 adjoining across the STI 2.

A gate insulating film 10 is arranged on side surfaces of the silicon pillar 5. The silicon pillar 5 has two side surfaces opposed in the X direction, on which gate electrodes 11 (11A and 11B) are arranged via the gate insulating film 10. More specifically, the gate electrode 11A is provided on the inner wall surfaces of the groove 54A. The gate electrode 11B is provided on the inner wall surfaces of the groove 54B. The gate electrodes 11A and 11B are independent of each other and not connected. The gate electrodes 11 are electrically insulated from the channel region of the silicon pillar 5 and the pillar upper diffusion layer 16 by the gate insulating film 10. Similarly, the gate electrodes 11 are also electrically insulated from the pillar lower diffusion layers 9 by the insulating films 8.

A first interlayer insulating film 12 is provided to cover the gate electrodes 11 and the insulating films 8 and fill the grooves 54. The first interlayer insulating film 12 is arranged so that its upper surface is flush with the upper surface of the STI 2. A second interlayer insulating film 20 is provided on the upper surfaces of the first interlayer insulating film 12 and the STI 2.

Metal wirings 33 and 34 (34A and 34B) are arranged on the upper surface of the second interlayer insulating film 20. The metal wiring 33 is connected to the pillar upper diffusion layer 16 serving as the source or drain region of the unit transistor 50 through two parallel first contact plugs 30 and a silicon plug 19. The first contact plugs 30 penetrate the second interlayer insulating film 20. The silicon plug 19 is provided on the upper surface 5b of the silicon pillar 5.

The metal wiring 34 is connected to the pillar lower diffusion layers 9 serving as the source or drain region of the unit transistor 50 through second contact plugs 31 (31A and 31B). The second contact plugs 31 penetrate the second interlayer insulating film 20, the first interlayer insulating film 12, and the insulating film 8.

Turning to FIG. 1A, the silicon pillar 5 having a rectangular shape when seen in a plan view is provided in the center portion in the X direction of the active region 1a surrounded by the STI 2. The silicon pillar 5 extends linearly in the Y direction, and constitutes the channel region of the unit transistor 50. Both end surfaces of the silicon pillar 5 in the Y direction coincide with both end surfaces of the active region 1a in the Y direction. In other words, the silicon pillar 5 is arranged to longitudinally cross the active region 1a.

The silicon pillar 5 has two side surfaces (first side surfaces) orthogonal to its longitudinal direction (Y direction) and two side surfaces (second side surfaces) parallel to the longitudinal direction. One insulating pillar 45 lying on the top side of the diagram is formed in contact with one of the first side surfaces of the silicon pillar 5. The other insulating pillar 45 lying on the bottom side of the diagram is formed in contact with the other first side surface of the silicon pillar 5.

The silicon plug 19, the first contact plugs 30, and the metal wiring 33 are arranged directly above the silicon pillar 5.

The ends 5A of the silicon pillar 5 in the Y direction are each in contact with one of the ends of the insulating pillars 45 in the Y direction. The other ends of the insulating pillars 45 are integrated with the STI 2 surrounding the silicon pillar 5.

The gate electrodes 11 are arranged on the two side surface portions of the silicon pillar 5 and the insulating pillars 45 opposed in the X direction, respectively. The gate electrodes 11 include the gate electrode 11A on one side surface portion and the gate electrode 11B on the other side surface portion. The gate electrodes 11 are formed on the entire surface of the silicon pillar 5, the insulating pillars 45, and the STI 2 which constitute the inner wall surfaces of the grooves 54.

Consequently, the gate electrode 11A is configured as closed loop wiring formed on the entire inner wall surfaces of the groove 54A. The closed loop wiring has the advantage that a feed contact for applying a gate voltage to the gate electrode 11A can be formed in an arbitrarily selected position. The same applies to the gate electrode 11B.

Two signal wirings 42 (42A and 42B) are arranged on the upper surface of the second interlayer insulating film 20. The signal wiring 42 is arranged in positions overlapping at least in part third contact plugs 41 which serve as gate feed contacts to the gate electrodes 11. More specifically, the signal wiring 42A is connected to the gate electrode 11A through a third contact plug 41A which penetrates the second interlayer insulating film 20 and the first interlayer insulating film 12. The same applies to the signal wiring 42B.

The second contact plugs 31 (31A and 32B) are arranged in the active region 1a on the right and left of the silicon pillar 5 in the X direction. The second contact plugs 31 each are preferably made of a plurality of contact plugs. The metal wiring 34 is arranged directly above and in contact with the upper surface of each of the second contact plugs 31.

Next, a method for manufacturing the semiconductor device according to the first embodiment will be described in detail.

Figure 3A:
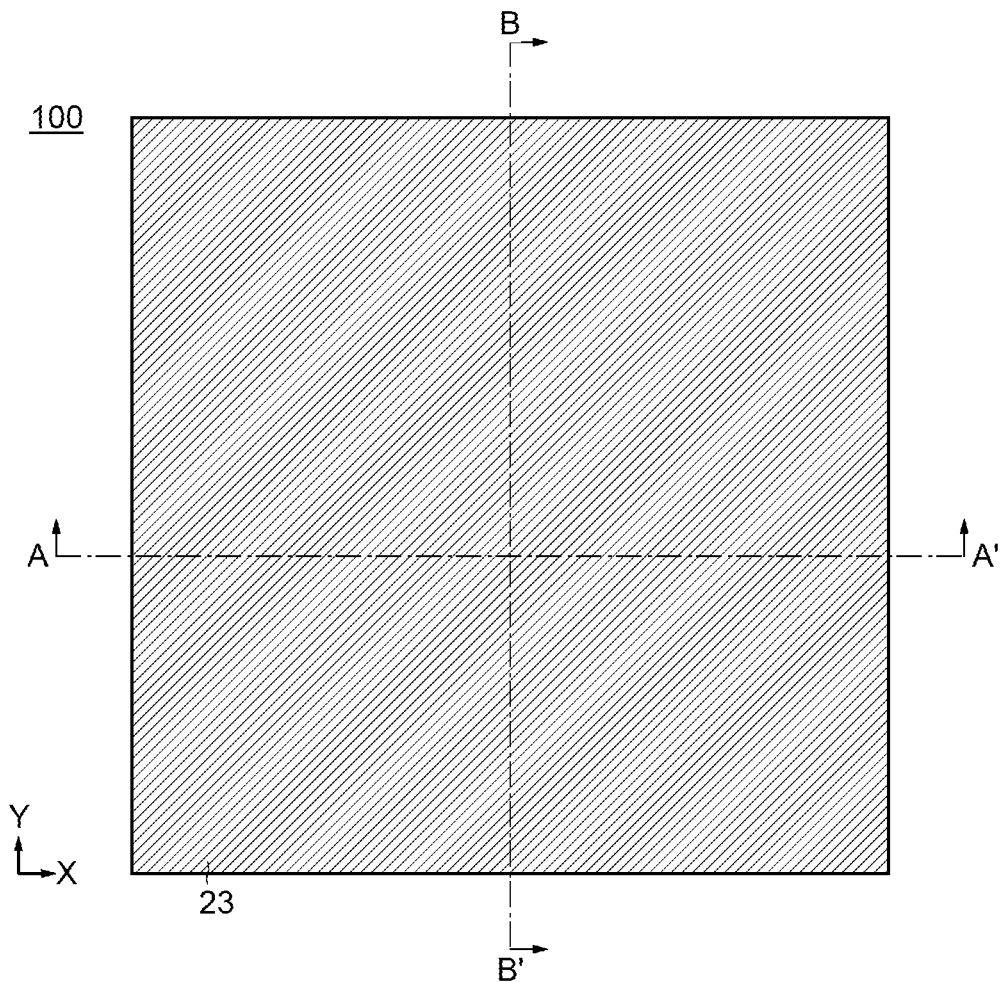
FIG. 3A is a plan view indicative of an embodiment of a process in a manufacturing method of the semiconductor device according to the first embodiment.
Figure 3B:
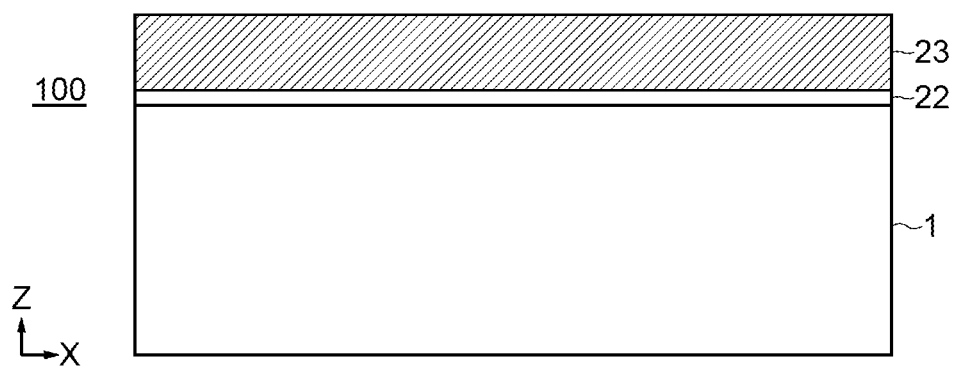
FIG. 3B is a cross-sectional view taken along a line A-A' of FIG. 3A.

To manufacture the semiconductor device 100, an STI formation step is initially performed. Turning to FIGS. 3A and 3B, an insulating film 22 made of a silicon dioxide film is formed with a thickness of 2 nm on the upper surface of the silicon substrate 1 by thermal oxidation. A first mask film 23 made of a silicon nitride film (SiN) is then formed with a thickness of 120 nm by chemical vapor deposition (CVD).

Figure 4A:
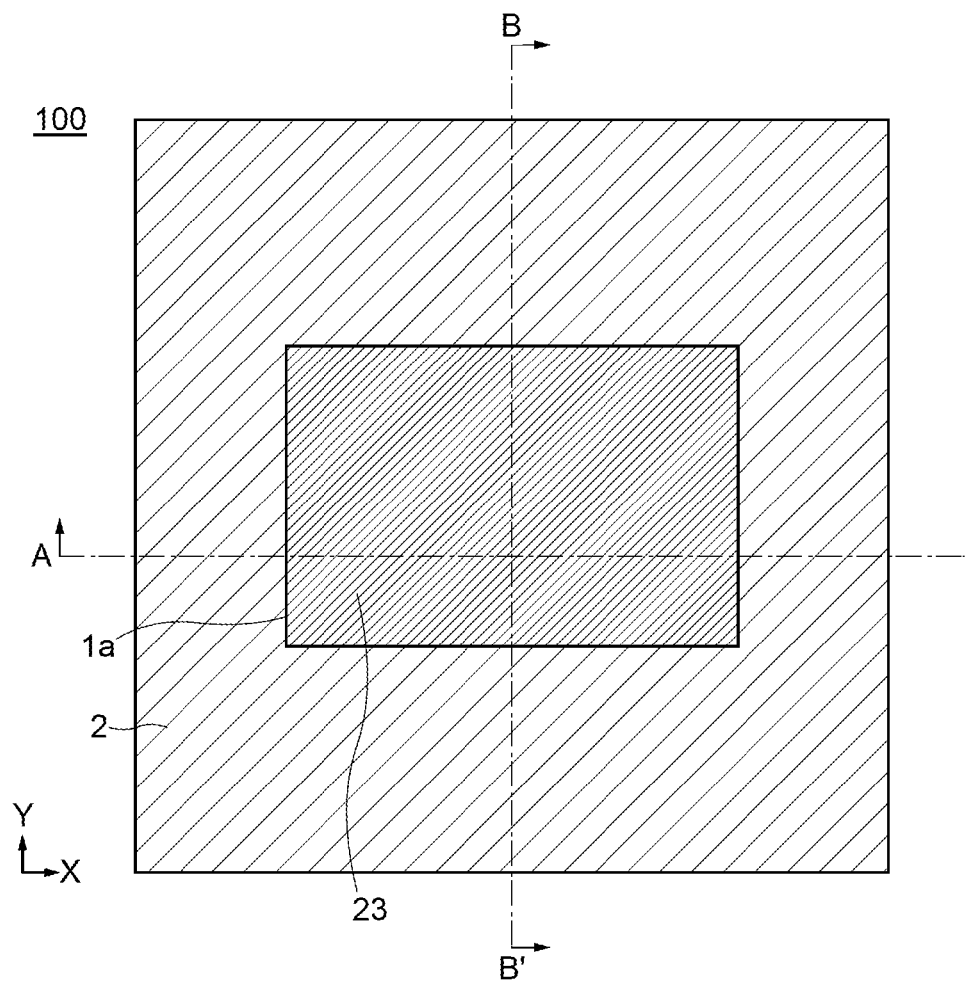
FIG. 4A is a plan view indicative of an embodiment of a process in a manufacturing method of the semiconductor device according to the first embodiment.
Figure 4B:
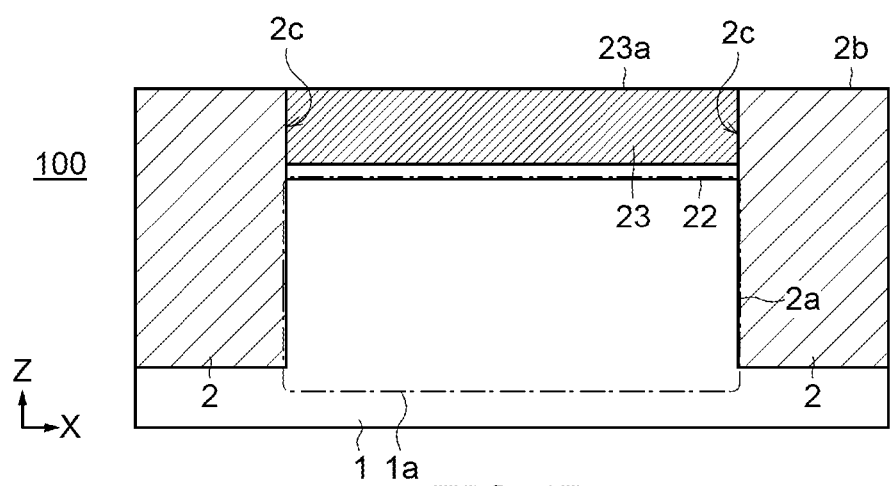
FIG. 4B is a cross-sectional view taken along a line A-A' of FIG. 4A.
Figure 5:
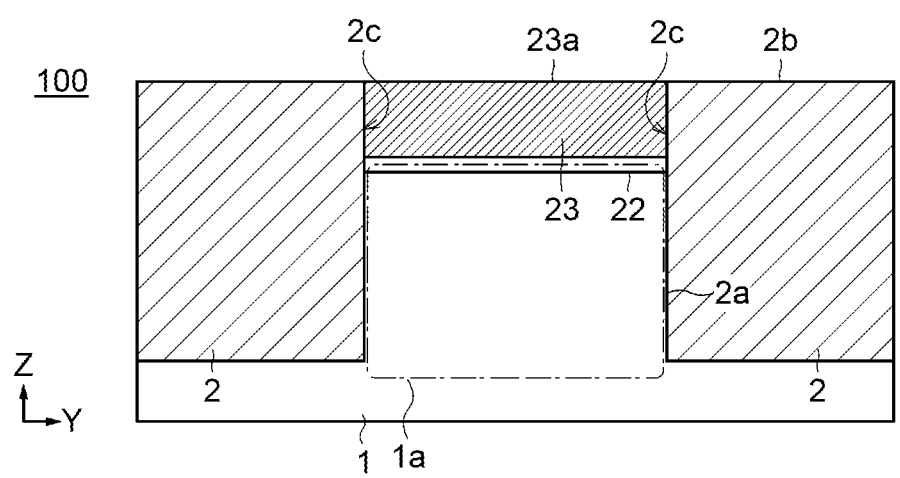
FIG. 5 is a cross-sectional view taken along a line B-B' of FIG. 4A.

Turning to FIGS. 4A, 4B, and 5, the STI 2 serving as an element isolation region is formed in the silicon substrate 1. To form the STI 2, the insulating film 22 and the first mask film 23 are initially patterned by using photolithography and dry etching. The first mask film 23 is thereby processed into a mask pattern of rectangular shape when seen in a plan view, the mask pattern defining the active region 1a. The upper surface of the silicon substrate 1 is exposed around the active region 1a.

Next, the silicon substrate 1 with the exposed upper surface is dry etched by using the first mask film 23 as a mask, thereby forming a 250-nm-deep STI groove 2a which surrounds the active region 1a and defines an STI region. The STI groove 2a is constituted by the silicon substrate 1, the insulating film 22, and the first mask film 23. The dry etching for forming the STI groove 2a reduces the thickness of the first mask film 23 to 70 nm.

Next, a thin silicon dioxide film (not shown) is formed on the inner walls of the STI groove 2a by thermal oxidation. A silicon dioxide film ($SiO_2$) serving as an element isolation insulating film is then deposited on the entire surface of the silicon substrate 1 by CVD so as to fill the inside of the groove. Using the first mask film 23 made of the silicon nitride film as a stopper, an unnecessary silicon dioxide film formed on the first mask film 23 is then removed by chemical mechanical polishing (CMP). This completes the STI 2 which is made of the silicon dioxide film embedded only in the STI groove 2a. The STI 2 is formed so that the upper surface 2b is planarized and coincides with the position of the upper surface 23a of the first mask film 23 in the Z direction. As a result, the upper surface 2b of the STI 2 is higher than the upper surface of the silicon substrate 1, and the side surface portions of the first mask film 23 are in contact with and surrounded by the STI 2. In such a manner, in the present embodiment, the upper surface 23a of the first mask film 23 and the upper surface 2b of the STI 2 need to be formed to be the same plane. As described above, the STI 2 is made of the silicon dioxide film, a material different from the silicon nitride film constituting the mask film 23. The upper surface 2b of the STI 2 is flush with the upper surface 23a of the first mask film 23. In such a configuration, the side surfaces of the first mask film 23 are covered with the side surfaces 2c of the STI 2 protruding above the upper surface of the semiconductor substrate 1 that constitutes the active region 1a. As a result, in a subsequent step of selectively removing the first mask film 23, the side surfaces 2c of the STI 2 function as an etching protection wall.

Figure 6A:
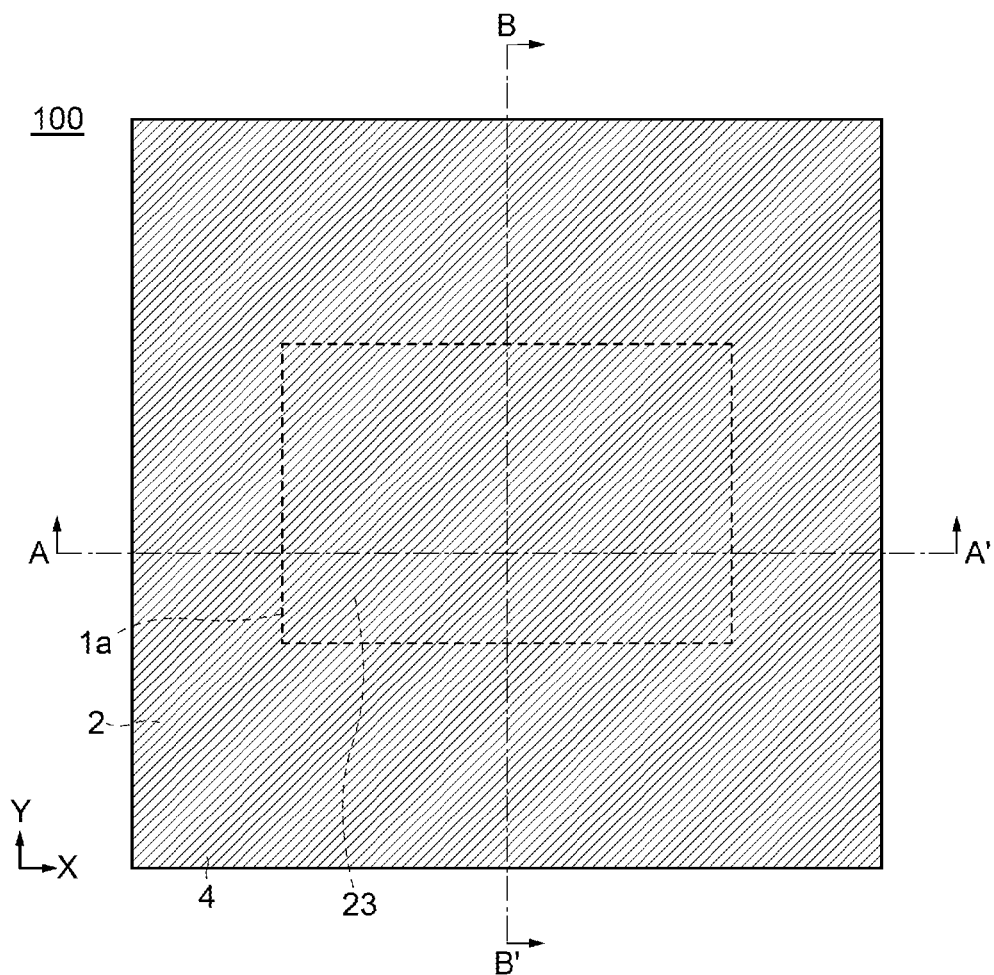
FIG. 6A is a plan view indicative of an embodiment of a process in a manufacturing method of the semiconductor device according to the first embodiment.
Figure 6B:
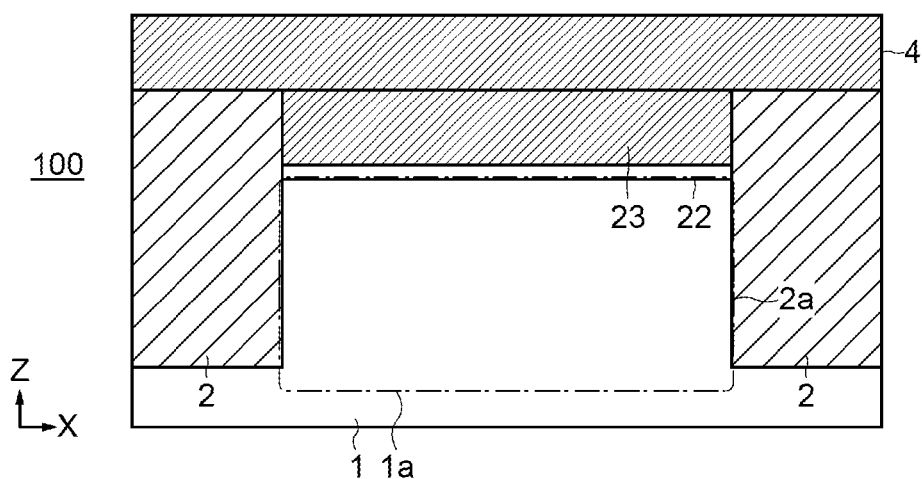
FIG. 6B is a cross-sectional view taken along a line A-A' of FIG. 6A.

Next, a composite pillar formation step is performed. Turning to FIGS. 6A and 6B, a second mask film 4 made of the same silicon nitride film (SiN) as that of the first mask film 23 is deposited with a thickness of 120 nm on the entire surface of the silicon substrate 1, i.e., the upper surface 23a of the first mask film 23 and the upper surface 2b of the STI 2 by CVD. The second mask film 4 is used as a mask for forming a composite pillar.

Figure 7A:
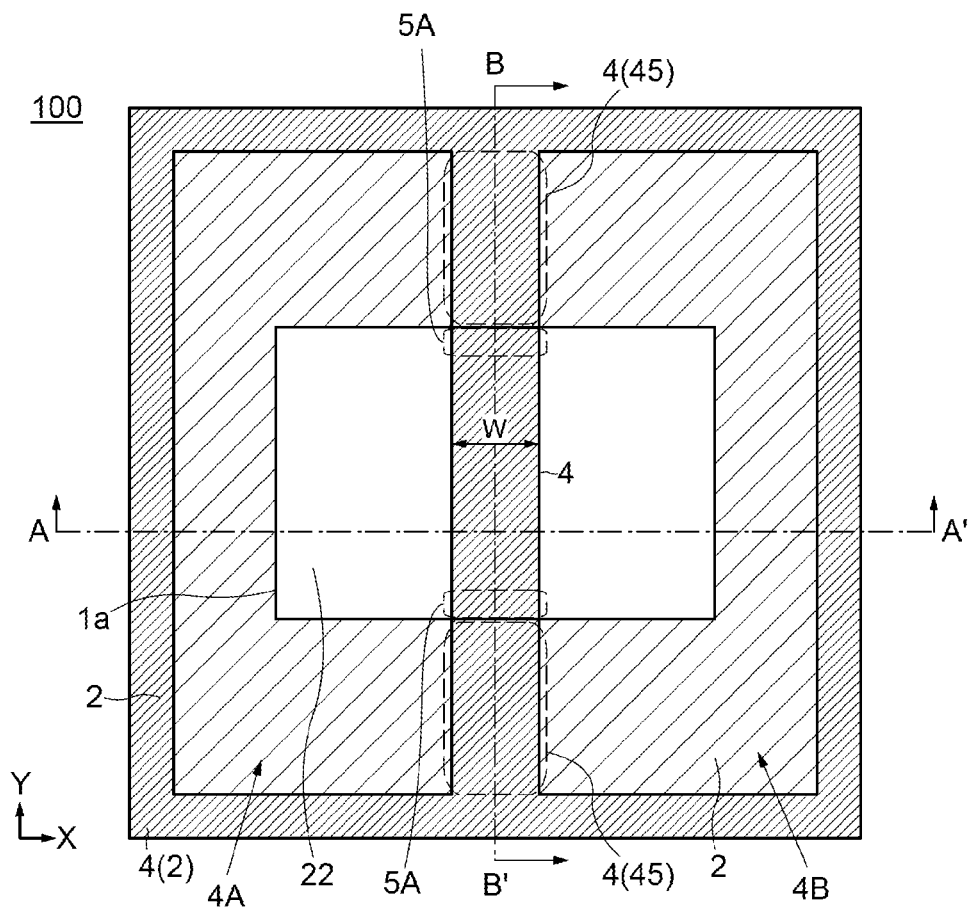
FIG. 7A is a plan view indicative of an embodiment of a process in a manufacturing method of the semiconductor device according to the first embodiment.
Figure 7B:
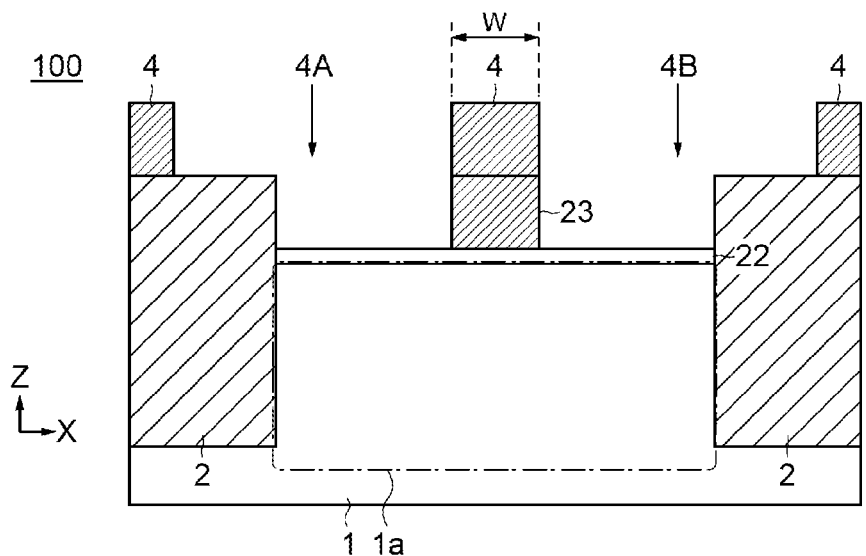
FIG. 7B is a cross-sectional view taken along a line A-A' of FIG. 7A.

Next, turning to FIGS. 7A and 7B, openings 4A and 4B are formed in the second mask film 4 by using photolithography and dry etching. The openings 4A and 4B are each formed to a rectangular pattern, excluding a center portion that has a width of W in the X direction of the active region 1a and longitudinally crosses the active region in the Y direction. Consequently, the openings 4A and 4B are each formed as a rectangle that overlaps three sides of the active region 1a and has three sides opposed to the three sides of the active region 1a in outer positions surrounding the active region 1a. The openings 4A and 4B are formed in symmetrical positions about a center line in the X direction of the center portion.

The second mask film 4 is selectively removed by anisotropic dry etching using a photoresist as a mask. Since the first mask film 23 made of the same silicon nitride film as that of the second mask film 4 lies under the second mask film 4 on the active region 1a, the first mask film 23 is etched subsequent to the second mask film 4, whereby the insulating film 22 is exposed. Meanwhile, the second mask film 4 on the STI 2 is removed to expose the upper surface of the STI 2. Subsequently, the photoresist mask is removed.

Figure 8A:
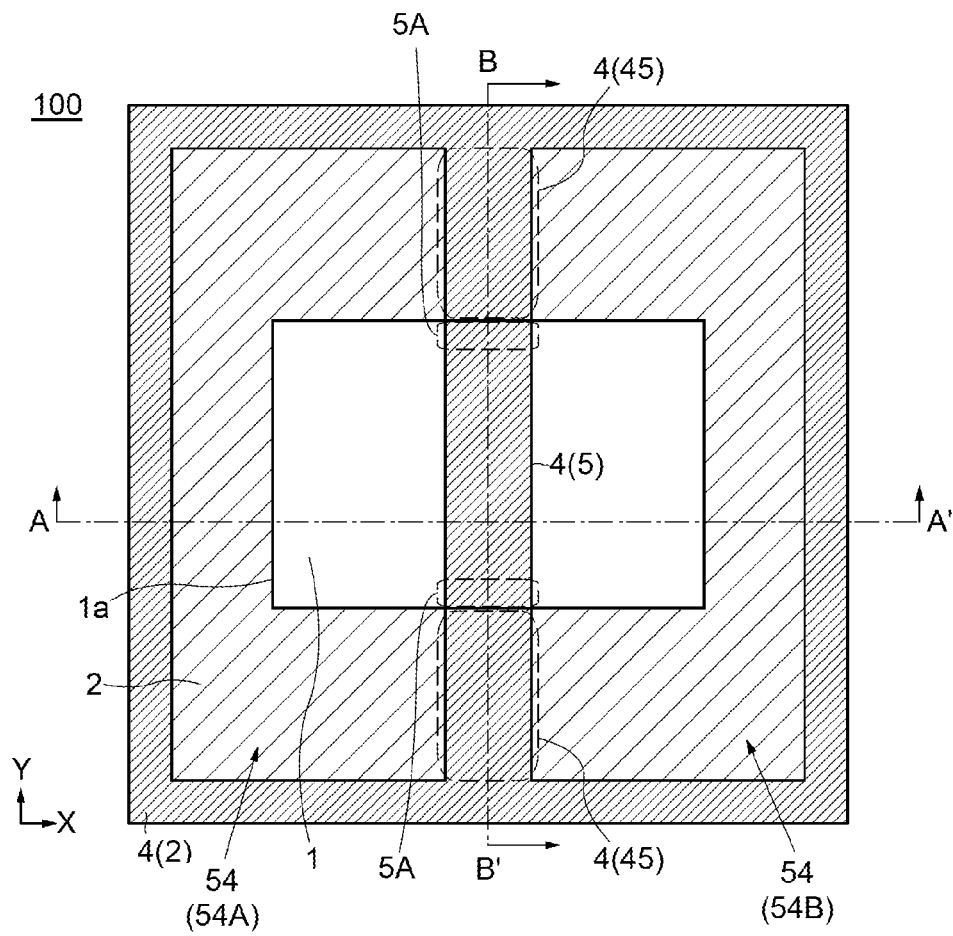
FIG. 8A is a plan view indicative of an embodiment of a process in a manufacturing method of the semiconductor device according to the first embodiment.
Figure 8B:
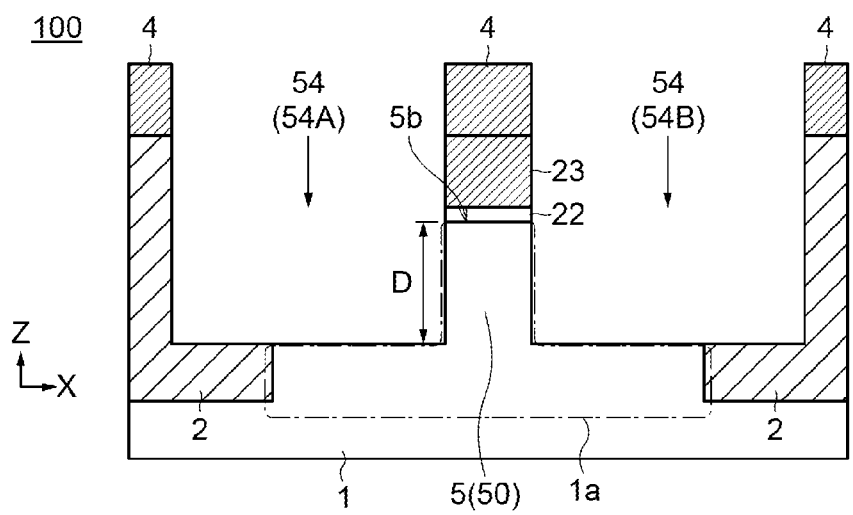
FIG. 8B is a cross-sectional view taken along a line A-A' of FIG. 8A.
Figure 9:
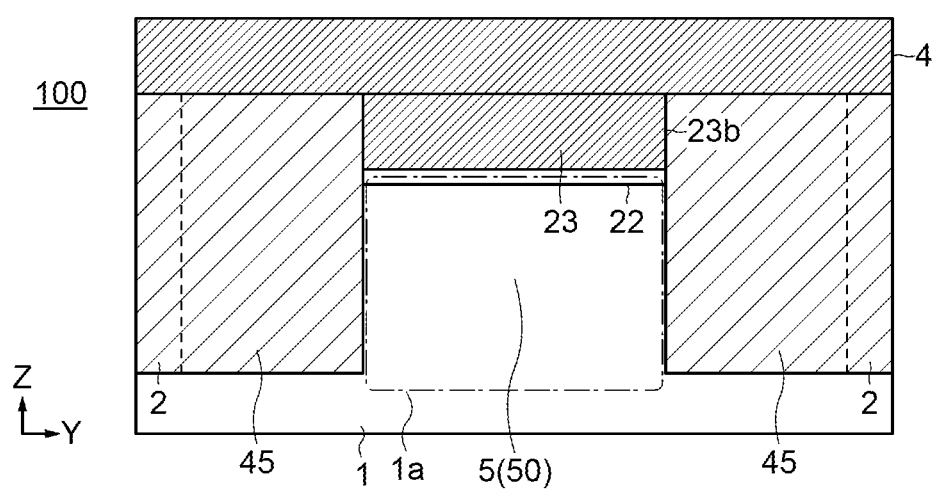
FIG. 9 is a cross-sectional view taken along a line B-B' of FIG. 8A.

Next, turning to FIGS. 8A, 8B, and 9, the silicon dioxide film constituting the STI 2 and the silicon substrate 1 constituting the active region 1a are selectively removed to the same depth by anisotropic dry etching using the second mask film 4 as a mask. This forms two composite grooves 54 (54A and 54B) which are formed by combining first grooves lying above the STI 2 and second grooves lying above the active region. The provision of the composite grooves 54 (54A and 54B) forms a composite pillar composed of the silicon pillar 5 and the two insulating pillars 45. The silicon pillar 5 lies in the center portion of the active region 1a in the X direction and serves as the channel of the unit transistor 50. The two insulting layer pillars 54 are positioned in contact with the ends of the silicon pillar 5 in the Y direction. The etching is performed so that the silicon pillar 5 has a height D of 150 nm. This reduces the thickness of the second mask film 4 to approximately 80 nm. In the anisotropic dry etching, the silicon substrate 1 and the silicon dioxide film constituting the STI 2 may be simultaneously etched at the same rate, whereas the silicon dioxide film is preferably etched first before the silicon substrate. A method of etching the silicon substrate first and then etching the silicon dioxide film is unfavorable because an etching residue of silicon tends to remain in the border between the active region 1a and the STI 2. In either case, the bottom surface of the active region 1a and the bottom surface of the STI 2 are formed to be the same plane.

The two side surfaces of the silicon pillar 5 opposed in the X direction are configured to constitute a part of the grooves 54A and 54B, respectively, and be continuous with the side surfaces of the insulating pillars 45. The side surface of the silicon pillar 5 and the side surfaces of the insulating pillars 45 lying on the same side are configured to be flush with each other. As shown in FIG. 8A, the portions of the STI 2 extending linearly in contact with the ends of the silicon pillar 5 in the Y direction constitute the insulating layer pillars 45 (first insulating layer pillars). The insulating pillars 45 are intended to extend the gate electrodes formed on the side surfaces of the silicon pillar 5 in a subsequent step to the side surfaces of the STI 2. One end of each insulating pillar 45 in the Y direction is thus in contact with an end of the silicon pillar 5 in the Y direction. The other end is connected to the STI 2 which is formed to surround the active region 1a. As shown in FIG. 8B, the second mask film 4 remains on the upper surface of the STI 2. Aside from the second mask film 4, the first mask film 23 lying immediately below the second mask film 4 also remains on the silicon pillar 5. Since the insulating pillars 45 are each connected to the silicon pillar 5 at one end in the Y direction, the grooves 54 for forming the insulating pillars 45 and the silicon pillar 5 are formed to straddle the silicon substrate 1 and the STI 2 when seen in a plan view.

Figure 10A:
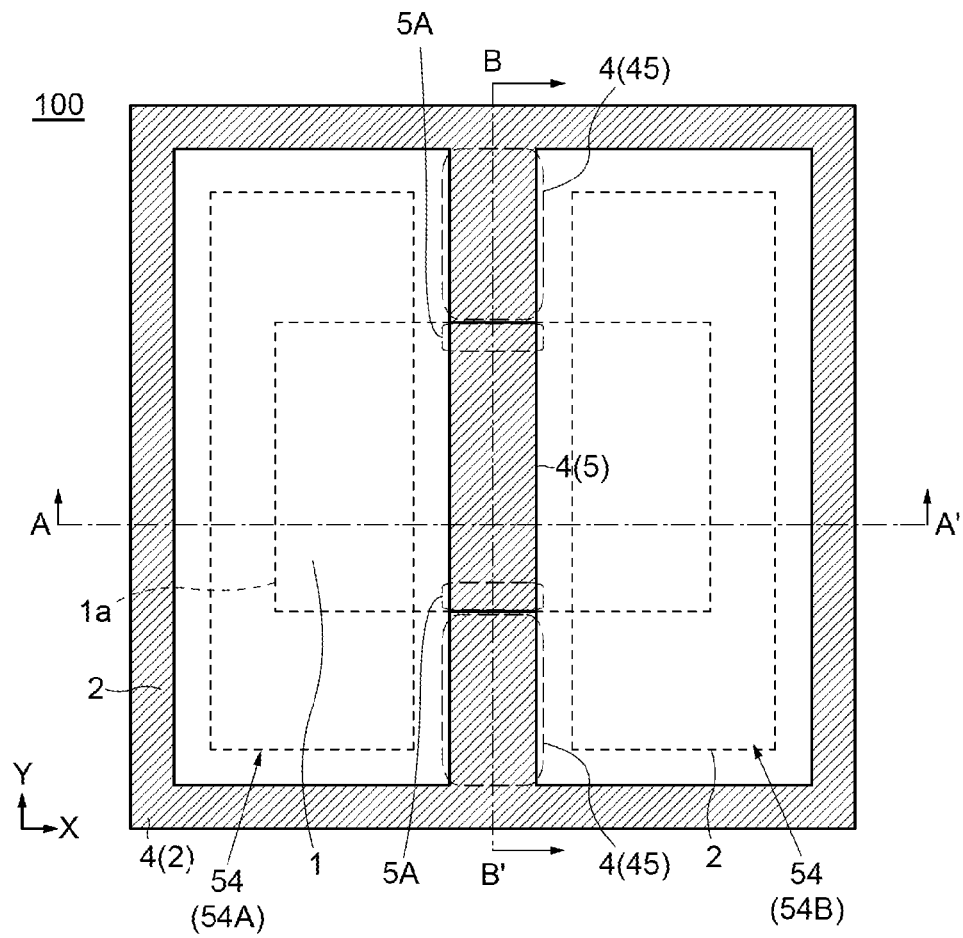
FIG. 10A is a plan view indicative of an embodiment of a process in a manufacturing method of the semiconductor device according to the first embodiment.
Figure 10B:
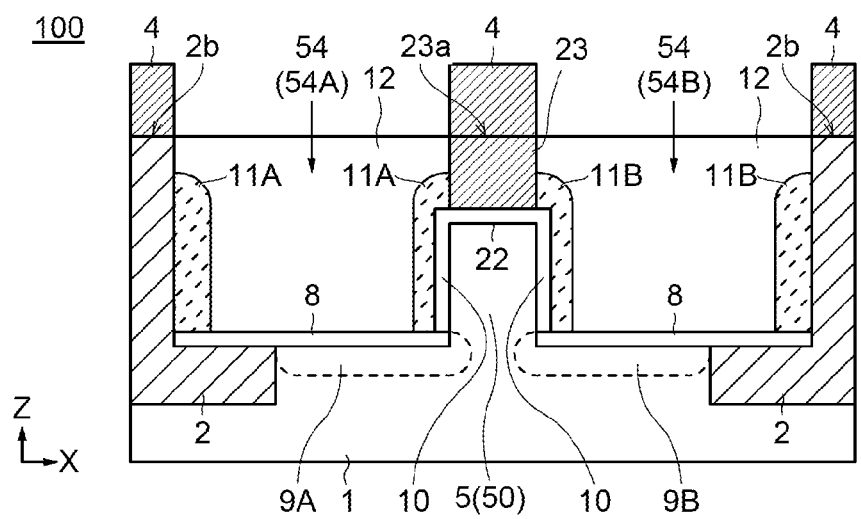
FIG. 10B is a cross-sectional view taken along a line A-A' of FIG. 10A.

Next, a first interlayer insulating film formation step is performed. Sidewalls (not shown) made of a silicon nitride film are initially formed to protect the side surfaces of the silicon pillar 5. Turning to FIGS. 10A and 10B, an insulating film 8 made of a 30-nm-thick silicon oxide film is then formed by thermal oxidation on the surface of the active region 1a exposed in the bottoms of the composite grooves 54. Next, pillar lower diffusion layers 9 (9A and 9B) are formed on the entire surface of the active region 1a lying under the insulating film 8 by ion implantation. The pillar lower diffusion layers 9A and 9B are electrically isolated from each other. Examples of the impurities to be implanted in the case of an N-type transistor include arsenic (As).

After the ion implantation, the sidewalls are removed to expose the side surfaces of the silicon pillar 5. Next, a gate insulating film 10 made of a silicon dioxide film is formed on the side surfaces of the silicon pillar 5 by thermal oxidation.

Next, a silicon film for forming the gate electrodes is deposited on the entire surface of the silicon substrate 1 by CVD. The entire surface is etched back to form the gate electrodes 11 (11A and 11B) on the side surfaces of the silicon pillar 5 opposed in the X direction. An example of the silicon film is a 30-nm-thick amorphous silicon film containing phosphorus or other n-type impurities. The impurity concentration is 1E20 to 1E21 (atoms/cm$^3$). The entire surface is etched back before a 1000° C. heat treatment is applied for 10 seconds to transform the amorphous silicon film into a polycrystalline silicon film and activate the impurities, whereby conductive gate electrodes 11 are formed. Depositing a polycrystalline silicon by CVD causes a problem of low controllability in the subsequent etch back step which is performed by anisotropic dry etching. The reason is that the deposited polycrystalline silicon film has asperities on the surface and grain boundaries inside. In contrast, the amorphous silicon film has no crystallinity and includes no grain boundary. The amorphous silicon film also has the advantage that it is possible to form an extremely flat surface which improves the controllability of the etch back. The polycrystalline silicon film obtained by thermally treating the silicon film formed in an amorphous state further has the effect of increasing the grain size and decreasing the conductor resistance as compared to the polycrystalline silicon film deposited in a polycrystalline state. This contributes to a reduction of the resistance of the gate electrodes 11.

When the gate electrodes 11A and 11B are formed on the side surfaces of the silicon pillar 5, the gate electrodes 11A and 11B are also formed on the side surfaces of the insulating pillars 45 and the STI 2 constituting the grooves 54 at the same time. The gate electrodes 11 thus constitute gate electrodes 11 of closed loop shape continuous over the four inner wall surfaces constituting the respective grooves 54. To connect the gate electrodes 11 formed on the side surfaces of the silicon pillar 5 with the gate electrodes 11 formed on the side surfaces of the STI 2, the formation of the insulating pillars 45 between the silicon pillar 5 and the STI 2 is essential.

Next, the first interlayer insulating film 12 made of a silicon dioxide film is formed on the entire surface by CVD so as to bury the silicon pillar 5 and the gate electrodes 11. The first interlayer insulating film 12 formed on the upper surface of the second mask film 4 is then planarized and removed by CMP until the upper surface of the second mask film 4 is exposed. This creates a situation that the composite grooves 54 are filled with the first interlayer insulating film 12. The first interlayer insulating film 12 whose upper surface is expose in the grooves 45 is then etched back by using anisotropic dry etching, whereby the upper surface of the interlayer insulating film 12 is lowered to the position of the upper surface 23a of the first mask film 23, i.e., the position of the upper surface 2b of the STI 2.

Figure 11A:
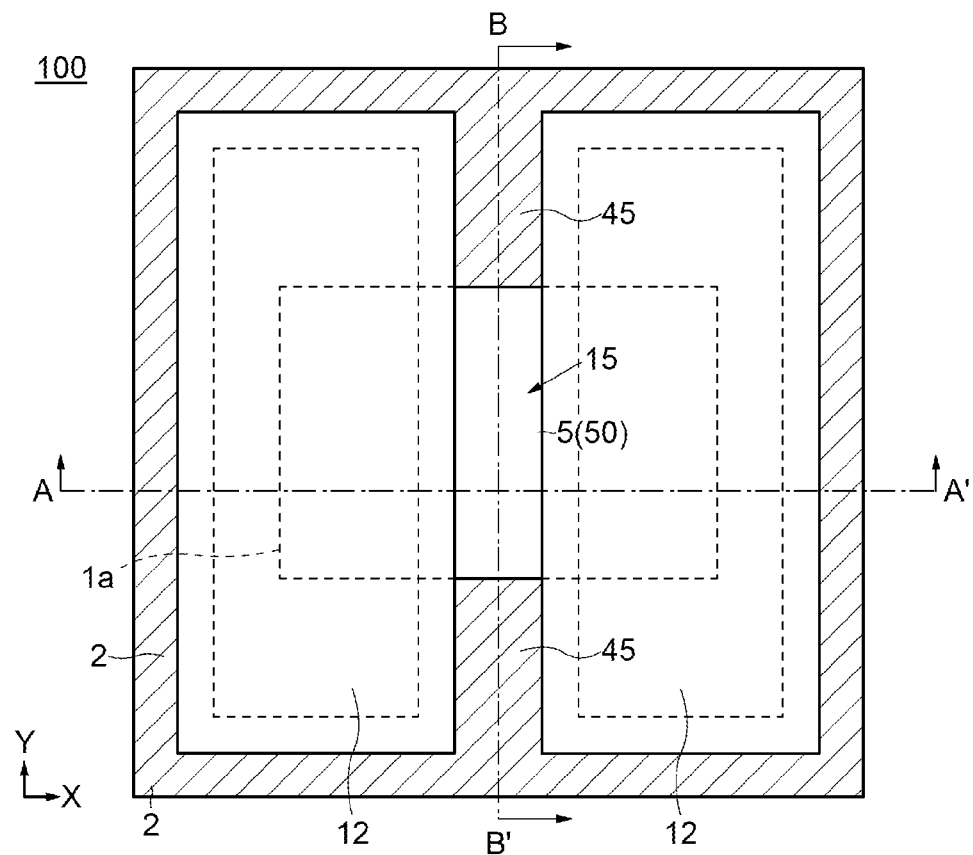
FIG. 11A is a plan view indicative of an embodiment of a process in a manufacturing method of the semiconductor device according to the first embodiment.
Figure 11B:
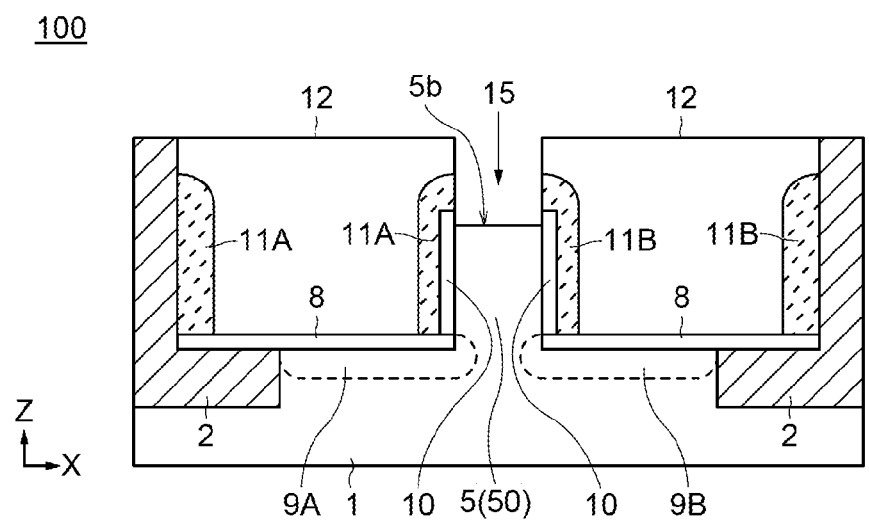
FIG. 11B is a cross-sectional view taken along a line A-A' of FIG. 11A.
Figure 12:
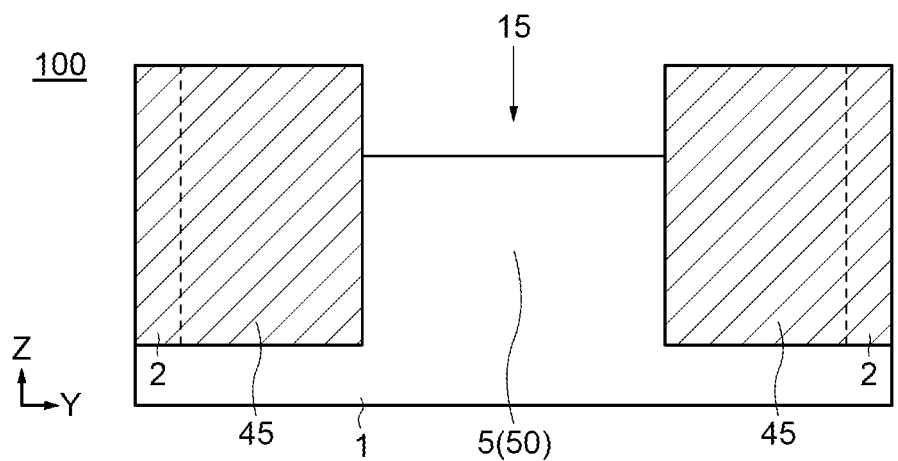
FIG. 12 is a cross-sectional view taken along a line B-B' of FIG. 11A.

Next, a first and second mask film removal step is performed. As shown in FIGS. 11A, 11B, and 12, the exposed second mask film 4 is selectively removed by wet etching using hot phosphoric acid heated to 160° C., for example. This removes the second mask film 4 on the STI 2. Meanwhile, on the silicon pillar 5, there is the 70-nm-thick first mask film 23 under the second mask film 4. Since the first mask film 23 is made of the same silicon nitride film, the first mask 23 is also selectively removed subsequent to the second mask film 4. The insulating film 22 is further removed by using a solution containing hydrofluoric acid, whereby an opening 15 is formed above the silicon pillar 5. The bottom of the opening 15 above the silicon pillar 5 exposes the upper surface 5b of the silicon pillar 5. The gate electrodes 11 are partly exposed from the sides of the opening 15.

As described above, the second mask film. 4 and the first mask film 23, both of which are a silicon nitride film, are removed by wet etching using hot phosphoric acid. As shown in the plan view of FIG. 11A, the first mask film 23 lying on the silicon pillar 5 is in contact with and surrounded by the first interlayer insulating film 12 on the active region 1a adjoining both sides of the silicon pillar 5 in the X direction and the STI 2 (the insulating pillars 45) adjoining both sides in the Y direction. The first interlayer insulating film 12 and the STI 2, both of which are a silicon dioxide film, are in susceptible to the etching using hot phosphoric acid and can thus remain without being corroded by the etching solution. In the step of removing the insulating film 22, the interlayer insulating film 12 and the STI 2 made of the same silicon dioxide film are also etched. Since the insulating film 22 is formed with an extremely small thickness of 2 nm and can be removed in a short time, the interlayer insulating film 12 and the STI 2 will not become uneven in shape. The upper portions of the insulating pillars 45 (STI 2) and the upper portion of the first interlayer insulating 12, in contact with the side surfaces of the first mask film 23 and protruding above the upper surface 5b of the silicon pillar 5, thus function as an etching protection wall for preventing the diffusion of the etching solution during the removal of the first mask film 23 by wet etching.

Figure 13A:
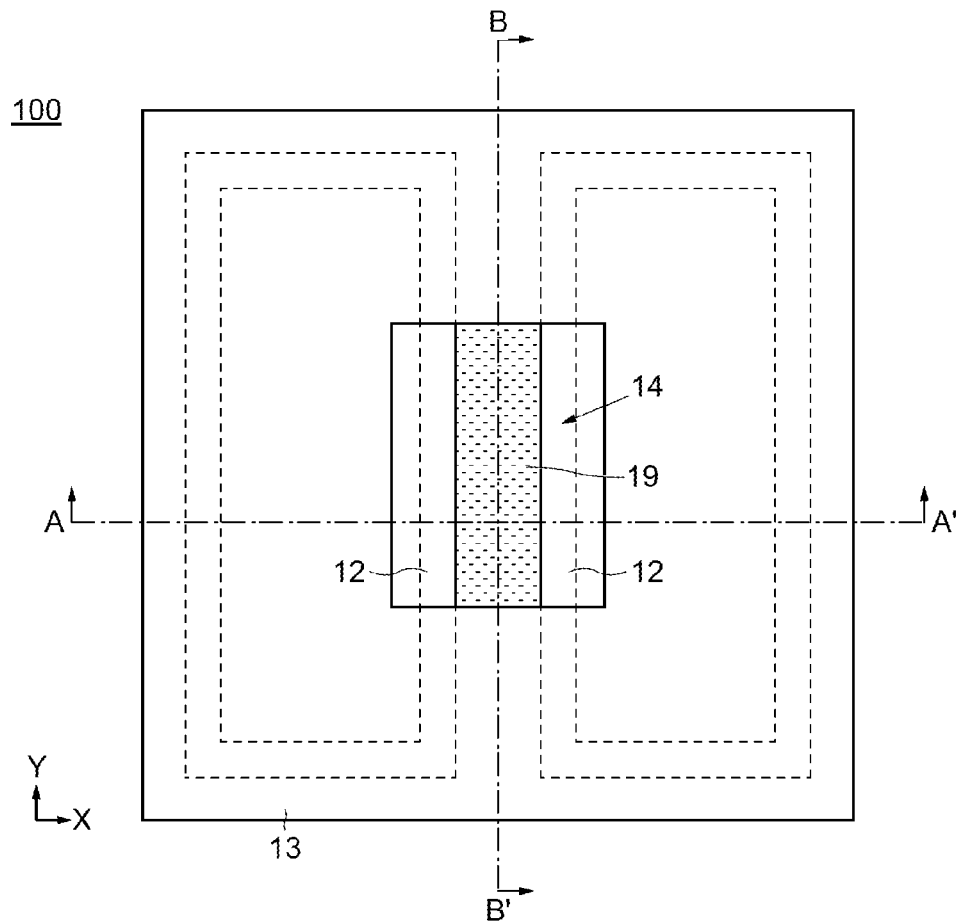
FIG. 13A is a plan view indicative of an embodiment of a process in a manufacturing method of the semiconductor device according to the first embodiment.
Figure 13B:
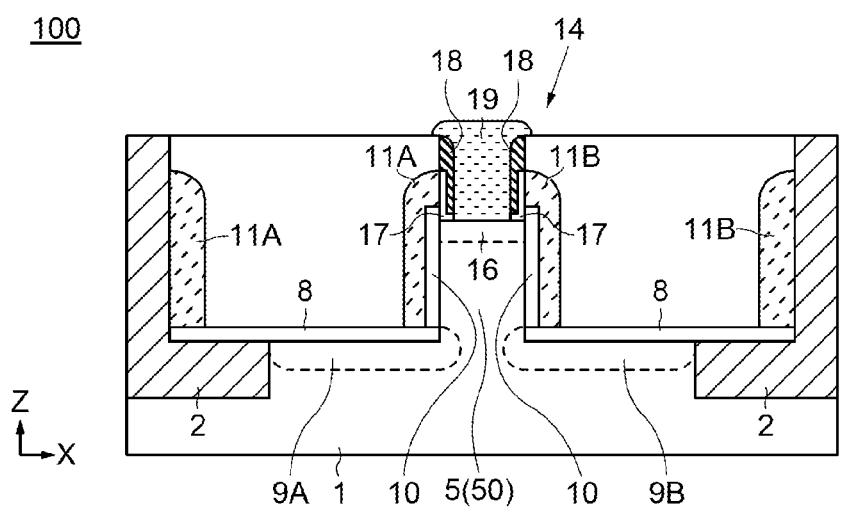
FIG. 13B is a cross-sectional view taken along a line A-A' of FIG. 13A.
Figure 14:
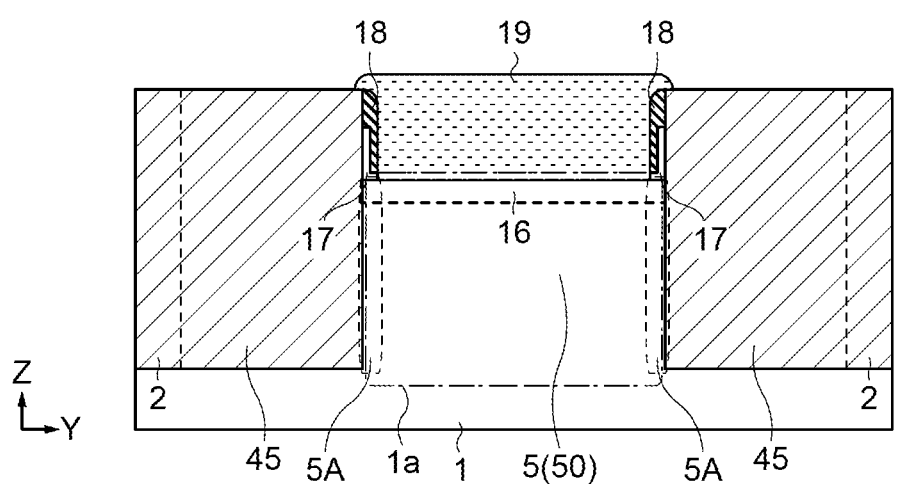
FIG. 14 is a cross-sectional view taken along a line B-B' of FIG. 13A.

Next, a contact plug formation step is performed. As shown in FIGS. 13A, 13B, and 14, an insulating film 17 made of a silicon dioxide film is formed on the inner walls of the opening 15 by thermal oxidation. Next, impurities (in the case of an N-type transistor, phosphorous (P) or arsenic) are ion-implanted into the top portion of the silicon pillar 5 through the opening 15, whereby the pillar upper diffusion layer 16 is formed. Next, a silicon nitride film is deposited by CVD and then etched back to form a sidewall film 18 on the inner walls of the opening 15. When forming the sidewall film 18, the insulating film 17 formed on the upper surface of silicon pillar 5 is removed to expose the upper surface of the silicon pillar 5. The insulating film 17 remains under the sidewall film 18 and on the exposed surfaces of the gate electrodes 11 in the opening 15. The sidewall film 18 functions to insulate a silicon plug to be formed later from the gate electrodes 11.

Next, a silicon plug 19 is grown on the upper surface of the silicon pillar 5 by selective epitaxial growth so as to fill the opening 15. In the case of an N-type transistor, arsenic or other impurities are ion-implanted to make the silicon plug 19 into an N-type conductor. The silicon plug 19 is thereby electrically connected to the pillar upper diffusion layer 16 formed in the top portion of the silicon pillar 5.

Figure 15A:
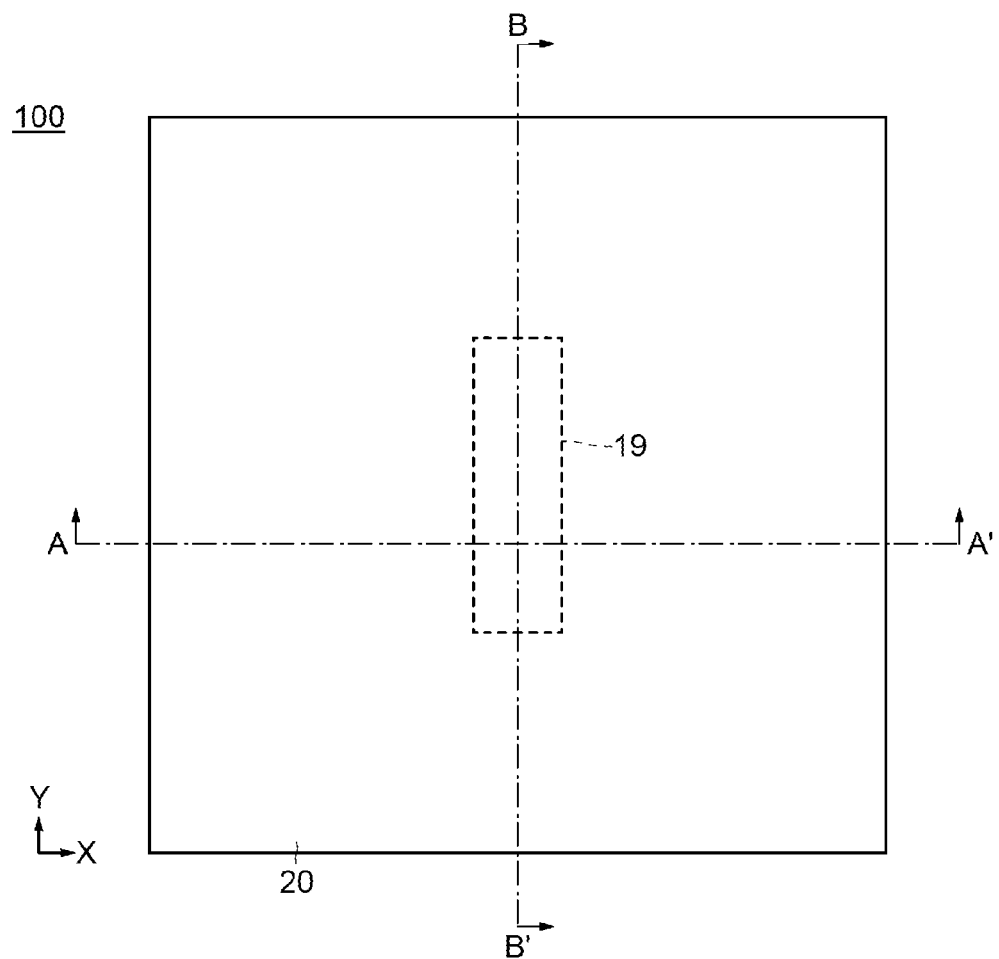
FIG. 15A is a plan view indicative of an embodiment of a process in a manufacturing method of the semiconductor device according to the first embodiment.
Figure 15B:
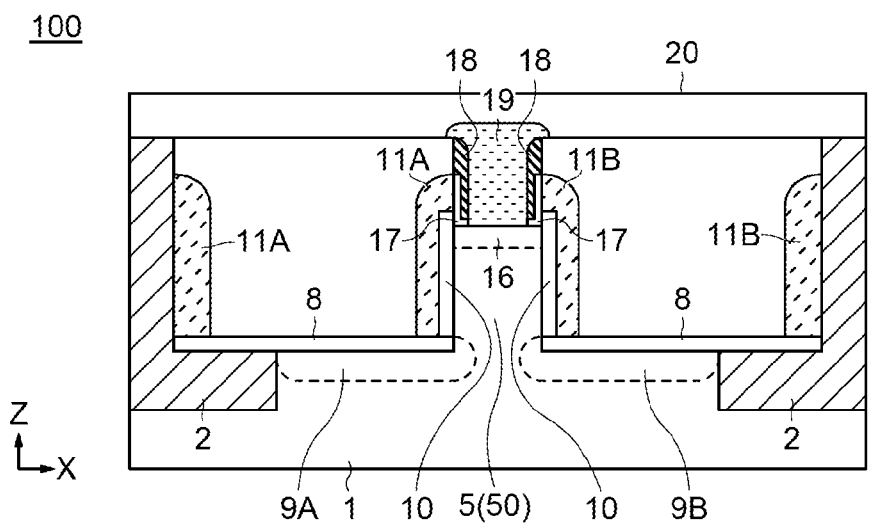
FIG. 15B is a cross-sectional view taken along a line A-A' of FIG. 15A.

Next, as shown in FIGS. 15A and 15B, the second interlayer insulating film 20 made of a silicon dioxide film is formed by CVD.

Figure 16A:
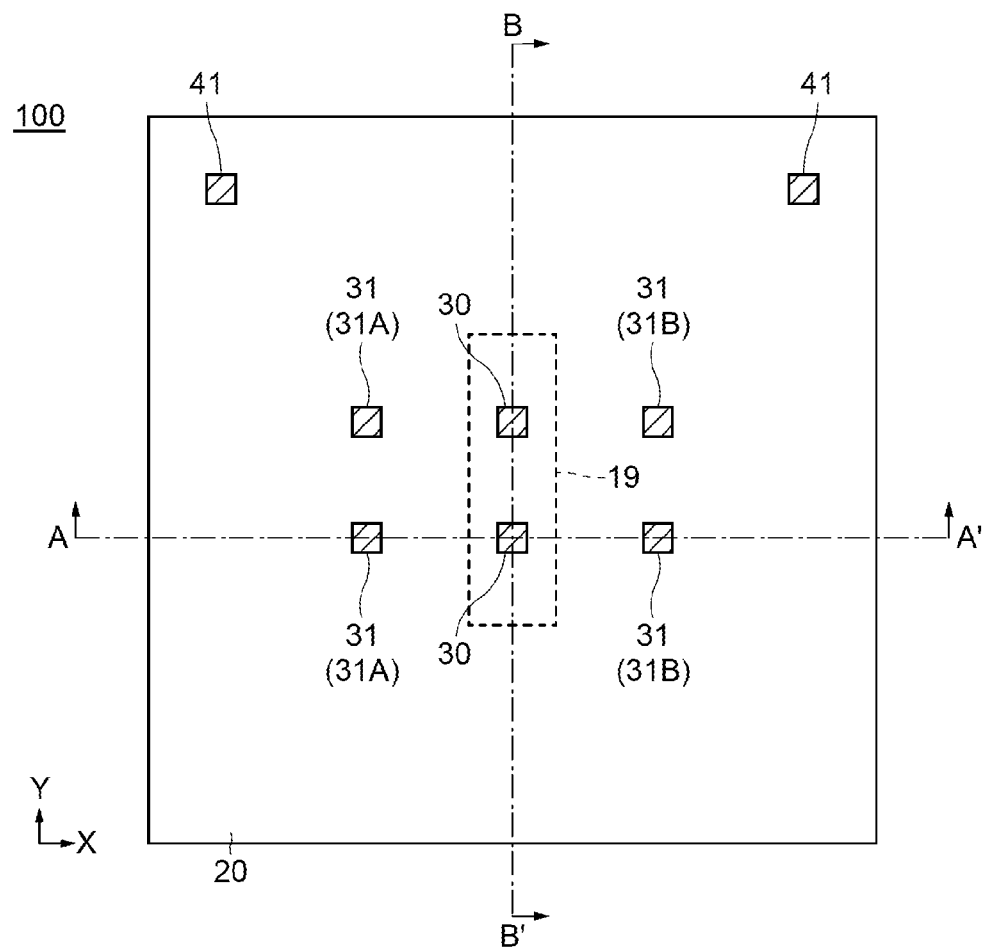
FIG. 16A is a plan view indicative of an embodiment of a process in a manufacturing method of the semiconductor device according to the first embodiment.
Figure 16B:
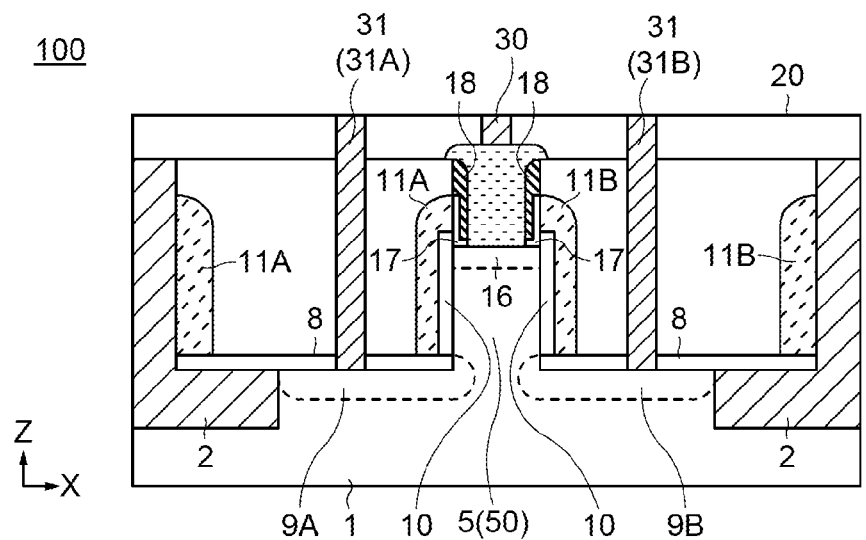
FIG. 16B is a cross-sectional view taken along a line A-A' of FIG. 16A.

Next, as shown in FIGS. 16A and 16B, the first contact plugs 30 connecting to the silicon plug 19, the second contact plugs 31 (31A and 31B) connecting to the pillar lower diffusion layers 9, and the third contact plugs 41 connecting to the gate electrodes 11 are formed. To form such contact plugs, contact holes are initially formed in the corresponding positions by photolithography and dry etching. Next, a metal film composed of tungsten (W), titanium nitride (TiN), and titanium (Ti) is deposited on the entire surface by CVD so as to fill the contract holes. The metal film formed on the upper surface of the second interlayer insulating film 20 is then removed by CMP to form the contact plugs 30, 31, and 41.

Next, a wiring formation step is performed. Turning to FIGS. 1A, 1B, and 2, the metal wiring 33, the metal wiring 34, and the signal wiring 42 made of tungsten and tungsten nitride (WN) are formed by sputtering. This completes the semiconductor device 100 shown in FIG. 1.

The semiconductor device 100 according to the first embodiment described above provides the following effects.

The STI 2 is formed so that the upper surface 2b of the STI 2 constitutes the same plane with the upper surface 23a of the first mask film. 23 formed on the active region 1a. The two composite grooves 54A and 54B are formed by using the second mask film 4 stacked and formed on the first mask film 23 and the STI 2 as a mask, whereby the silicon pillar 5 is formed in the area sandwiched between the two composite grooves. The first interlayer insulating film. 12 is embedded into the composite grooves 54 so that its upper surface forms the same plane with the upper surface position of the first mask film 23. The second mask film 4 and the first mask film 23 are then removed. According to such a method, the first mask film 23 formed on the silicon pillar is sandwiched between the insulating pillars 45 (STI 2) in the Y direction and between the two portions of the first interlayer insulating film 12 in the X direction. As a result, the first mask film 23 is configured to be embedded in a recess surrounded by the insulating films made of the different material in four directions. In other words, the first mask film 23 is in an independent area isolated from other areas made of the same material. With such a configuration, the first interlayer insulating film 12 arranged in the composite grooves 54 and the insulating pillars 45 function as the etching protection wall for preventing the etching solution from flowing out when removing the first mask film 23 on the silicon pillar 5 by wet etching. The first mask film. 23 lying directly above the silicon pillar 5 can thus be reliably removed by itself.

Next, a second embodiment of the present invention will be described in detail with reference to the drawings. The following diagrams are configured similarly to those of the first embodiment. A description common to the first embodiment will be omitted. The following description deals only with differences of the second embodiment.

Figure 17A:
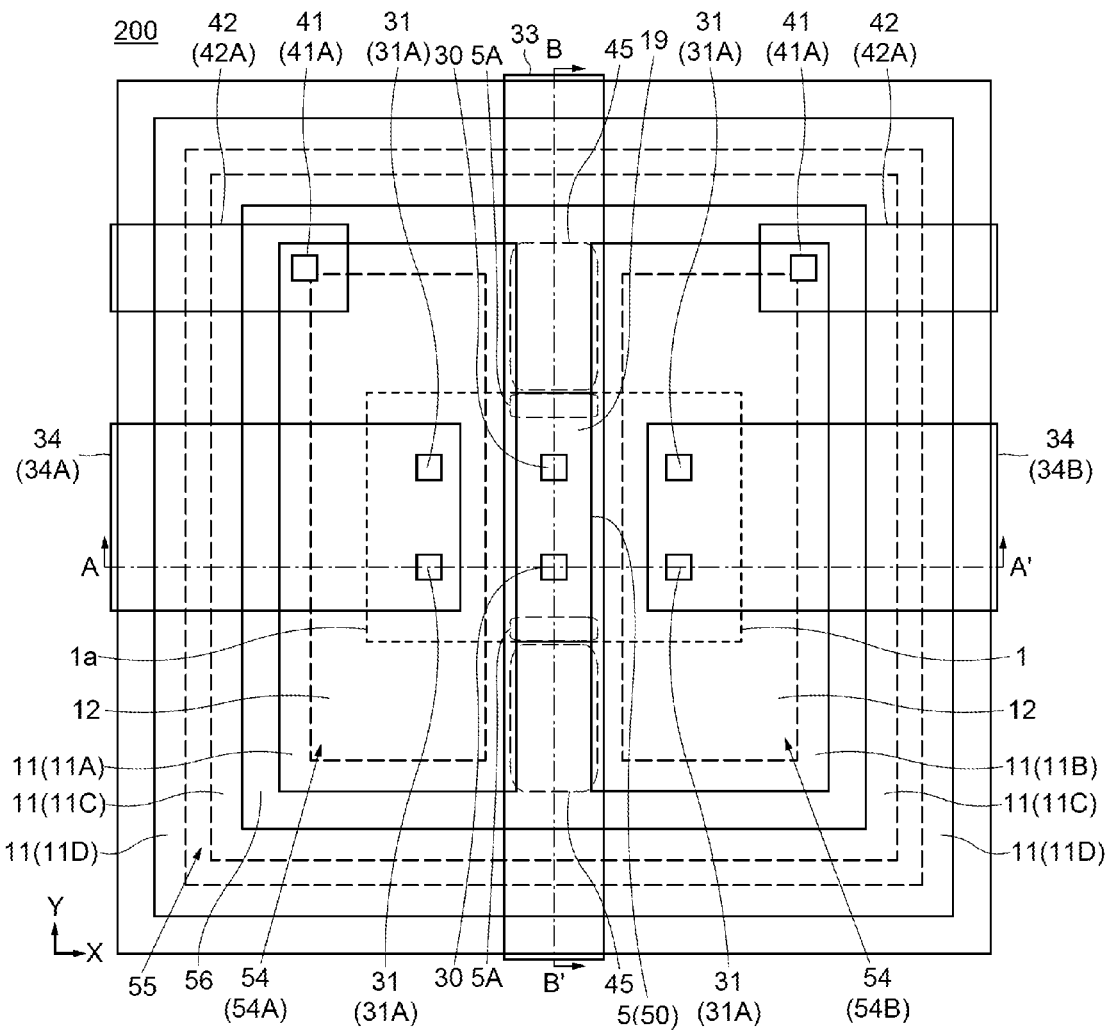
FIG. 17A is a schematic plan view showing a configuration of a semiconductor device according to a second embodiment of the present invention.
Figure 17B:
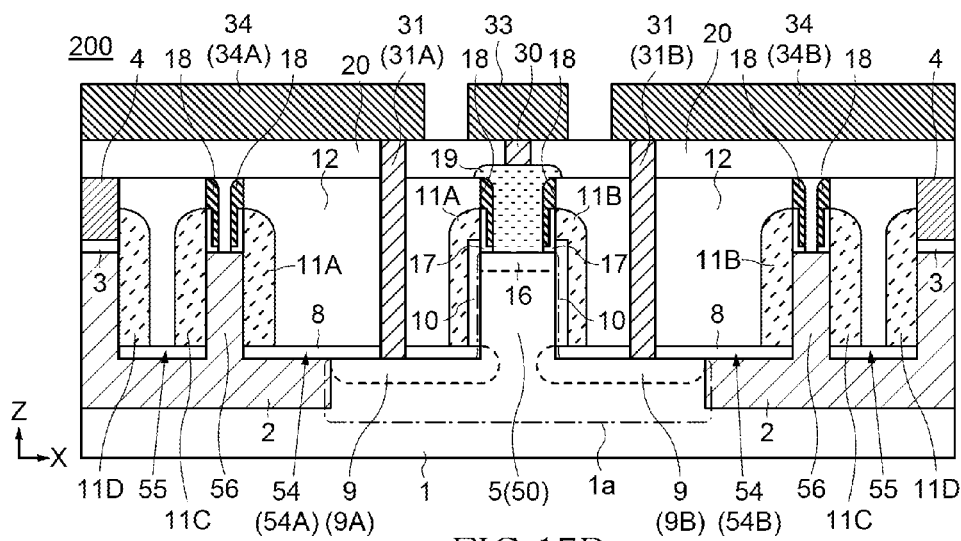
FIG. 17B is a schematic cross-sectional view taken along a line A-A' of FIG. 17A.
Figure 18:
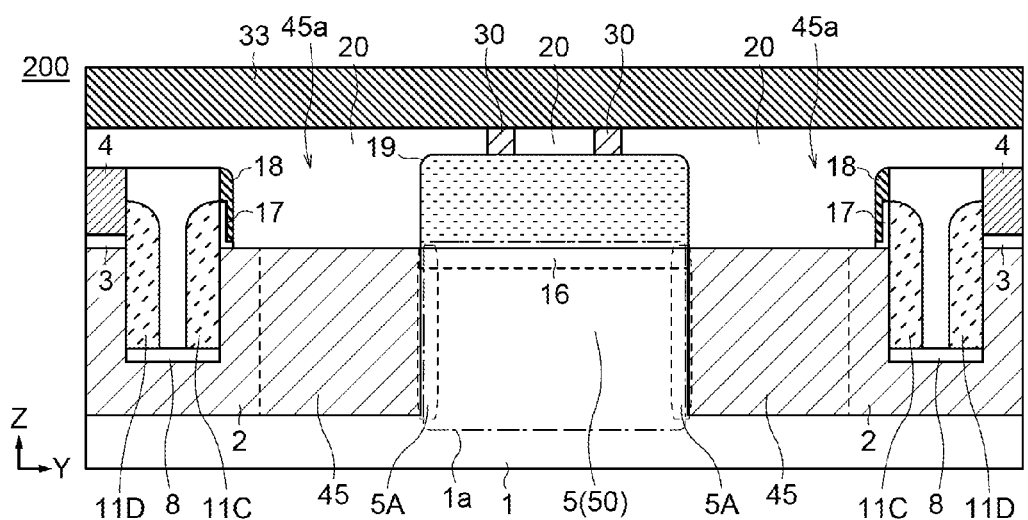
FIG. 18 is a schematic cross-sectional view taken along a line B-B' of FIG. 17A.

Turning to FIGS. 17B and 18, a groove 55 is formed in the STI 2 so as to sandwich the silicon pillar 5 and the insulating pillars 45 in the Y direction. The inner walls of the groove 55 function as an element isolation region. One of the side surfaces of the inner walls constitutes a part of an insulating pillar 56 (second insulating pillar). The insulating pillar 56 is formed by arranging the groove 55 and the grooves (openings) 54 in the STI 2. The upper surfaces of the insulating pillars 45 and 56 are at the same height as the upper surface of the silicon pillar 5.

The gate insulating film 10 is arranged on the side surfaces of the silicon pillar 5. The gate electrodes 11 (11A and 11B) are arranged on the side surfaces of the silicon pillar 5 via the gate insulating film 10. More specifically, the gate electrodes 11A and 11B are formed on the inner wall surfaces of the grooves 54 and on one side surface of the insulating pillar 56. Gate electrodes 11 (11C and 11D) are formed on the inner wall surfaces of the groove 55. The gate electrode 11C is arranged on one side surface of the groove 55. The gate electrode 11D is arranged on the side surface of the STI 2 constituting the other side surface of the groove 55, the inner wall surfaces of an insulating film 3 stacked on the upper surface of the STI 2, and a part of the inner wall surfaces of a mask film 4 stacked on the upper surface of the insulating film 3. The one side surface of the groove 55 on which the gate electrode 11C is arranged constitutes the other side surface of the insulating pillar 56. Note that the gate electrodes 11C and 11D do not have a function as a gate electrode, but are referred to as a gate electrode for convenience of description.

The insulating film 3 is arranged on the upper surface of the STI 2. The mask film 4 is further formed to cover the insulating film 3. The first interlayer insulating film 12 is formed in an area surrounded by the wall surfaces of the STI 2, the insulating film 3, and the mask film 4 so as to cover the gate electrodes 11 and the insulating film 8 in the grooves 54 and 55. The second interlayer insulating film 20 is formed on the upper surfaces of the mask film 4 and the first interlayer insulating film 12.

The sidewall film 18 and the insulating film 17 are arranged on the side surfaces of the silicon plug 19 on the upper surface of the silicon pillar 5. The sidewall film 18 and the insulating film 17 electrically insulate the silicon plug 19 from the gate electrodes 11. The insulating film 17 and the sidewall film 18 are also arranged on the upper surfaces of the insulating pillars 45 and 56, but without the function of insulating a silicon plug 19 from the gate electrodes 11 since there is no silicon plug 19.

Next, turning to FIG. 17A, the ends 5A of the silicon pillar 5 in the Y direction are in contact with one end of the respective insulating pillars 45 in the Y direction. The other ends of the insulating pillars 45 in the Y direction are integrated with the STI 2 surrounding the silicon pillar 5. More specifically, the other ends of the insulating pillars 45 in the Y direction are integrated with the insulating pillar 56 which constitutes a part of the STI 2.

The gate electrodes 11 are arranged not only on the inner wall surfaces of the grooves 54A and 54B but also on the two side surface portions of the groove 55. The gate electrodes 11 include the gate electrode 11C on the side surface portion of the insulating pillar 56 constituting a part of the groove 55 and the gate electrode 11D on the side surface portion of the STI 2 constituting a part of the groove 55. The gate electrodes 11 are formed on the entire side surfaces of the silicon pillar 5, the insulating pillars 45 and 56, and the STI 2. It should be appreciated that the gate electrodes 11C and 11D do not function substantially as a gate electrode. The gate electrodes 11C and 11D are formed simultaneously with the gate electrodes 11A and 11B, and thus referred to as gate electrodes for convenience of description.

Next, a method for manufacturing the semiconductor device 200 according to the second embodiment will be described in detail.

Figure 19A:
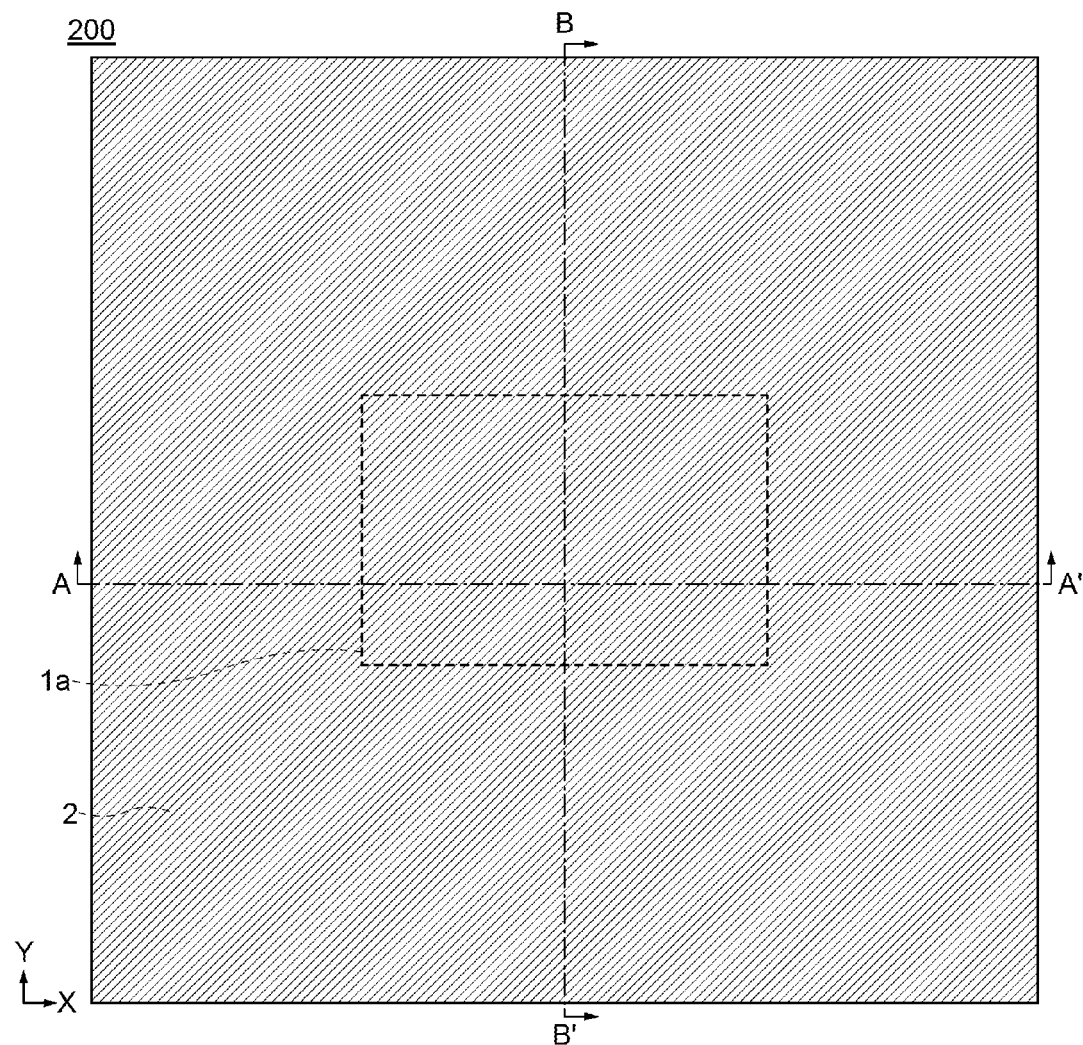
FIG. 19A is a plan view indicative of an embodiment of a process in a manufacturing method of the semiconductor device according to the second embodiment.
Figure 19B:
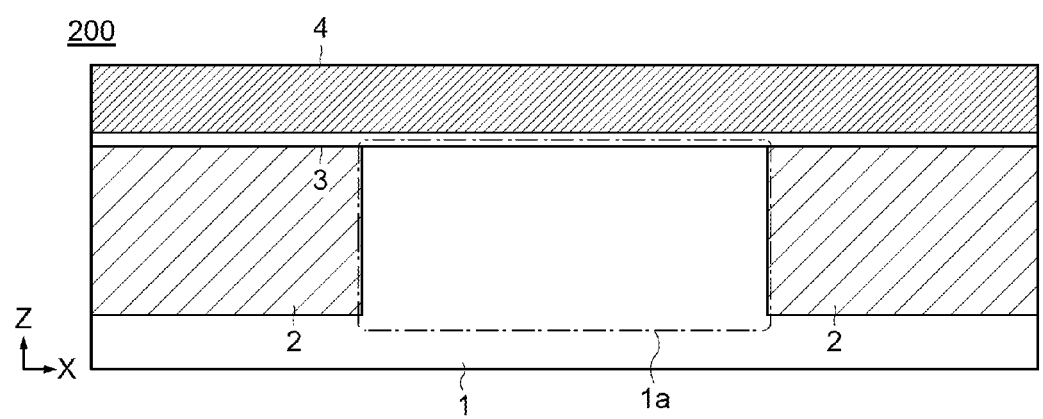
FIG. 19B is a cross-sectional view taken along a line A-A' of FIG. 19A.

To manufacture the semiconductor device 200, turning to FIGS. 19A and 19B, an STI 2 serving as an element isolation region is initially formed on a silicon substrate 1. To form the STI 2, a groove (not shown) is initially formed in the substrate 1 by using photolithography and dry etching. Next, a thin silicon dioxide film (not shown) is formed on the entire surface of the silicon substrate 1 including the inner walls of the groove by thermal oxidation. A silicon dioxide film is then deposited on the entire surface of the silicon substrate 1 by CVD so as to fill up the groove. Subsequently, the unnecessary silicon dioxide film on the upper surface of the silicon substrate 1 is removed by CMP so that the silicon dioxide film remains only in the groove. This completes the STI 2. Here, the position of the upper surface of the STI 2 coincides with that of the upper surface of the remaining silicon substrate 1.

Next, an insulating film 3 made of a silicon dioxide film is formed on the upper surface of the silicon substrate 1 by CVD. A mask film 4 made of a silicon nitride film is then deposited with a thickness of 120 nm.

Figure 20A:
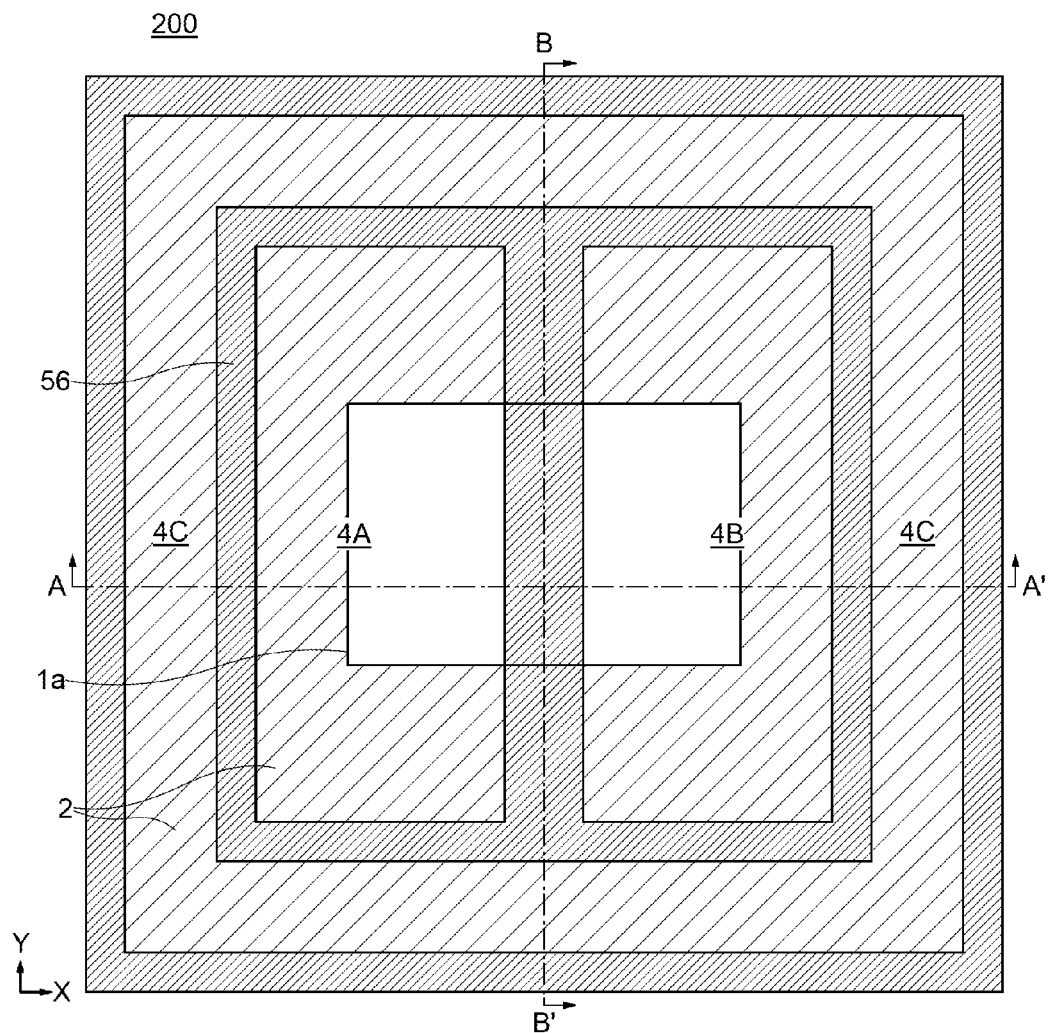
FIG. 20A is a plan view indicative of an embodiment of a process in a manufacturing method of the semiconductor device according to the second embodiment.
Figure 20B:
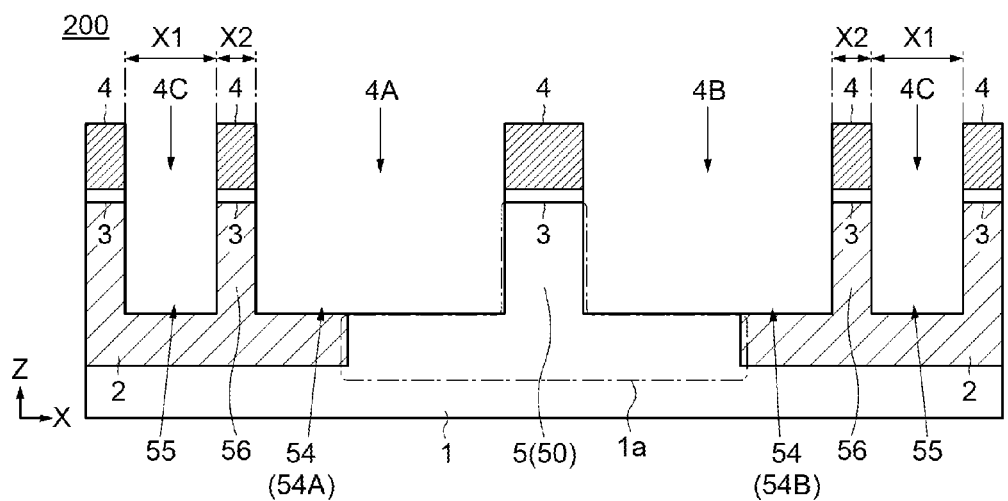
FIG. 20B is a cross-sectional view taken along a line A-A' of FIG. 20A.
Figure 21:
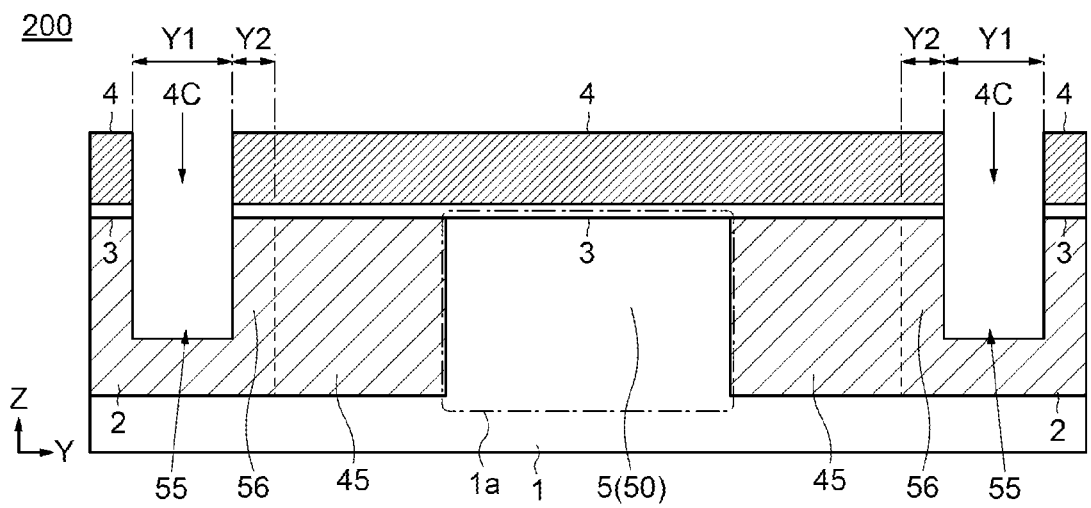
FIG. 21 is a cross-sectional view taken along a line B-B' of FIG. 20A.

Next, turning to FIGS. 20A, 20B, and 21, the insulating film 3 and the mask film 4 are patterned by using photolithography and dry etching. The patterned openings 4A and 4B expose the silicon substrate 1 and the STI 2. The opening 4C exposes the STI 2. The opening 4C has widths X1 and Y1 of 30 nm. The remaining mask film 4 also has widths X2 and Y2 of 30 nm.

Next, grooves 54 (54A and 54B) are formed by dry etching using the mask film 4 as a mask, so that the exposed silicon substrate 1 has a depth of 150 nm. This forms the silicon pillar 5 serving as the channel of the unit transistor 50 and the insulating pillars 45 for connecting gate electrodes to the STI 2. Similarly, a groove 55 of closed loop shape is formed by dry etching so that the exposed STI 2 has a depth of 150 nm. This forms the insulating pillar 56 for connecting gate electrodes to the STI 2. The insulating pillar 56 can be formed by forming not only the groove 55 but the grooves 54 as well. Here, the insulating film 3 and the mask film 4 remain on the upper surfaces of the silicon pillar 5, the insulating pillars 45 and 56, and the STI 2. The silicon pillar 5 and the insulating pillars 45 and 56 are laid out as shown in FIG. 20A. Since the insulating pillar 56 is arranged inside the STI 2 so as to surround the unit transistor 50, the groove 55 for forming the insulating pillar 56 is formed in the area of the STI 2 when seen in a plan view.

Figure 22A:
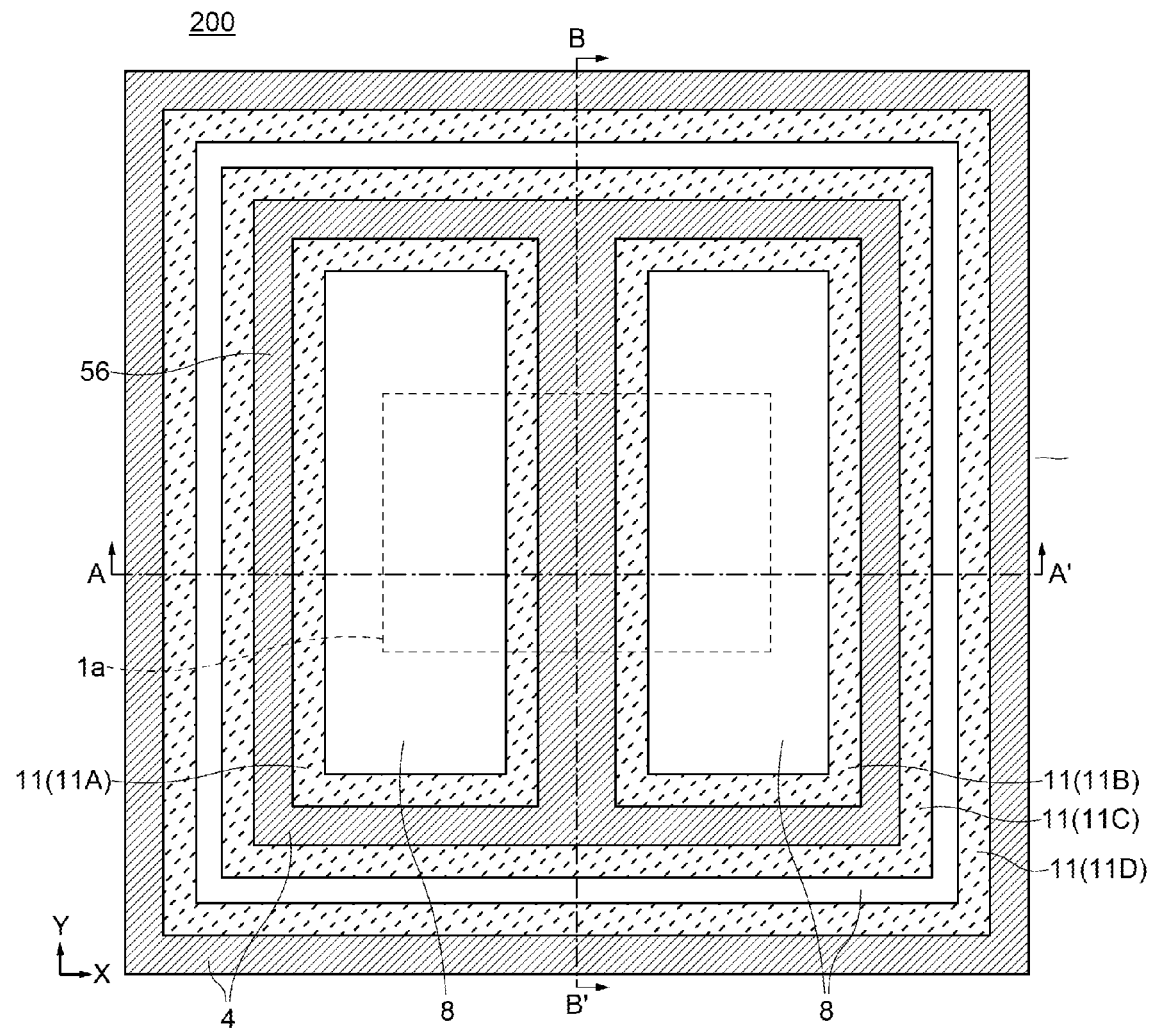
FIG. 22A is a plan view indicative of an embodiment of a process in a manufacturing method of the semiconductor device according to the second embodiment.
Figure 22B:
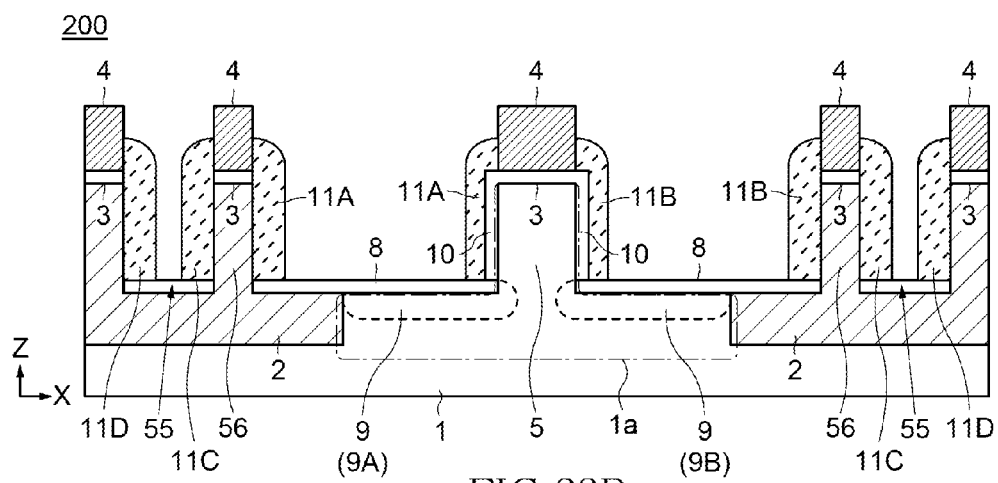
FIG. 22B is a cross-sectional view taken along a line A-A' of FIG. 22A.
Figure 23:
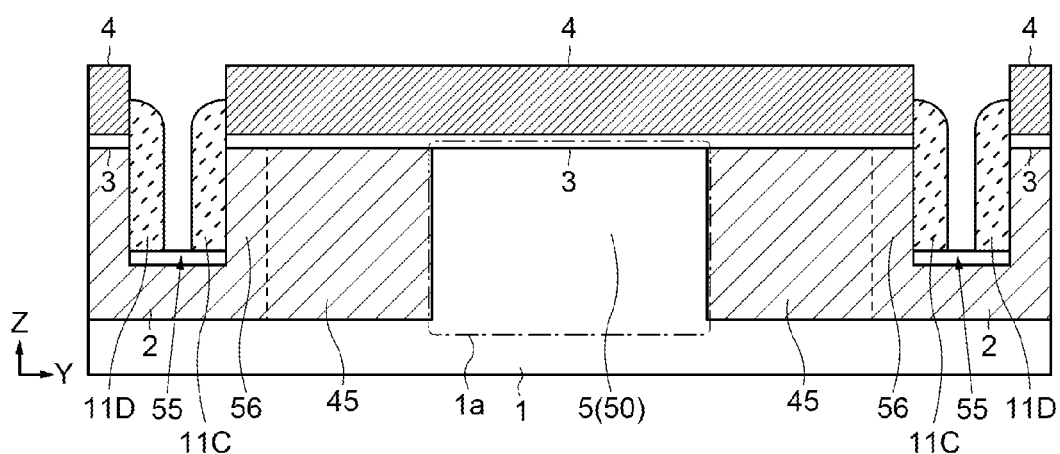
FIG. 23 is a cross-sectional view taken along a line B-B' of FIG. 22A.

Next, turning to FIGS. 22A, 22B, and 23, an insulating film 8, pillar lower diffusion layers 9 (9A and 9B), and a gate insulating film 10 are formed by the fabrication method described in FIGS. 10A and 10B. Next, a polysilicon film (polycrystalline silicon film) for forming gate electrodes is deposited on the entire surface of the silicon substrate 1 by CVD. The entire surface is then etched back to form gate electrodes 11 on the side surfaces of the grooves 54 and 55. When the gate electrodes 11 (11A and 11B) are formed in the grooves 54 on the side surfaces of the silicon pillar 5 in the X direction, the gate electrodes 11 are also simultaneously formed on the side surfaces of the insulating pillars 45 and the side surfaces of the insulating pillar 56 constituting the grooves 54. The mask film 4 remaining above the silicon pillar 5 and the insulating pillars 45 and 56 functions, along with the pillars, as a protrusion layer for increasing the height of the gate electrodes 11 to reduce the distance between the gate electrodes 11 and the signal wiring 42.

The gate electrode 11A on one side surface of the silicon pillar 5 is connected to the gate electrode 11A on one side surface of the insulating pillar 56 through the gate electrode 11A on one side surface of each of the insulating pillars 45. Similarly, the gate electrode 11B on the other side surface of the silicon pillar 5 is connected to the gate electrode 11B on the other side surface of the insulting layer pillar 56 through the gate electrode 11B on the other side surface of each of the insulating pillars 45. To extend the gate electrodes 11 from the silicon pillar 5 to the side surfaces of the insulating pillar 56, it is essential to connect the silicon pillar 5 to the insulating pillars 45 and connect the insulating pillars 45 to the insulating pillar 56. When the gate electrodes 11 (11C and 11D) are formed on the side surfaces of the groove 55, it follows that the gate electrode 11C is formed on the side surfaces of the insulating pillar 56 constituting the groove 55, and the gate electrode 11D is formed on the side surfaces of the STI 2 constituting the groove 55.

Figure 24A:
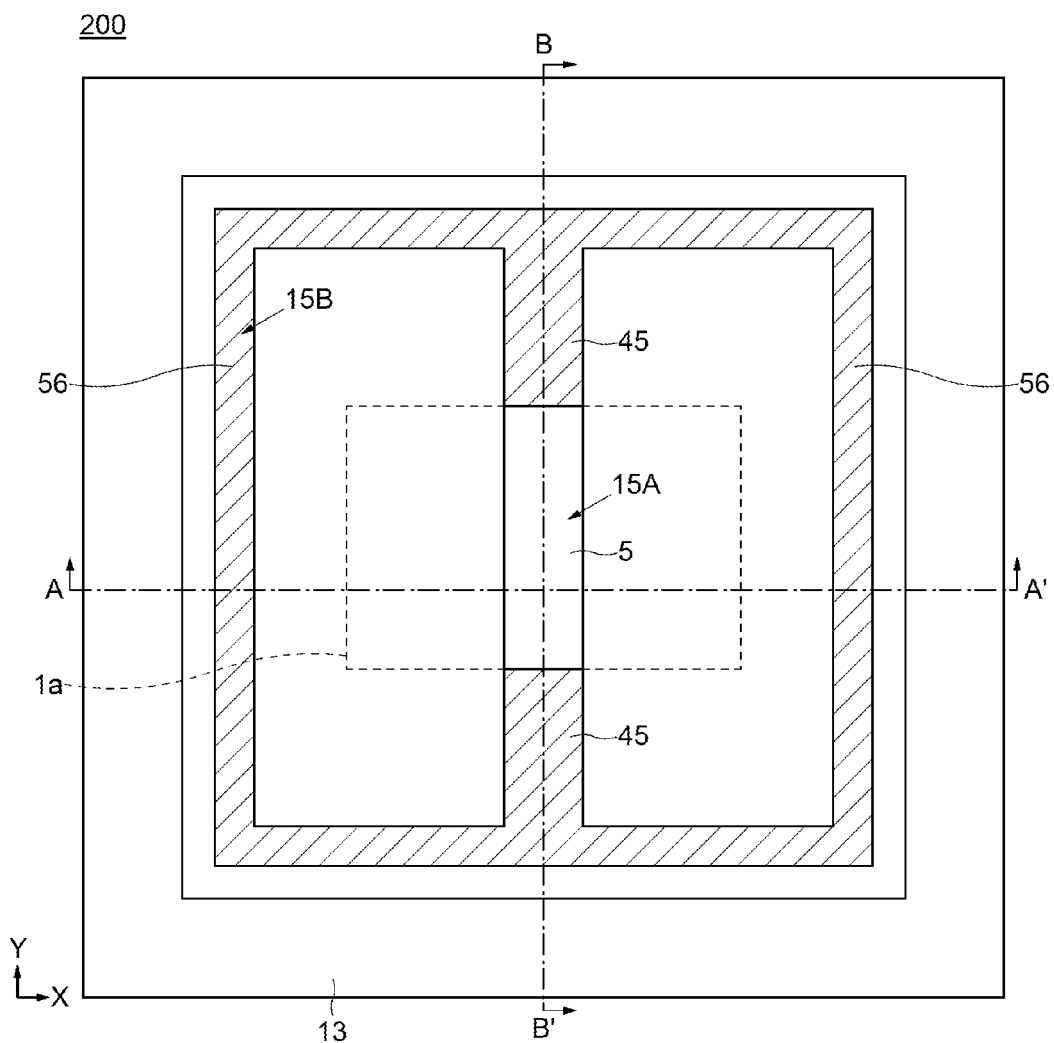
FIG. 24A is a plan view indicative of an embodiment of a process in a manufacturing method of the semiconductor device according to the second embodiment.
Figure 24B:
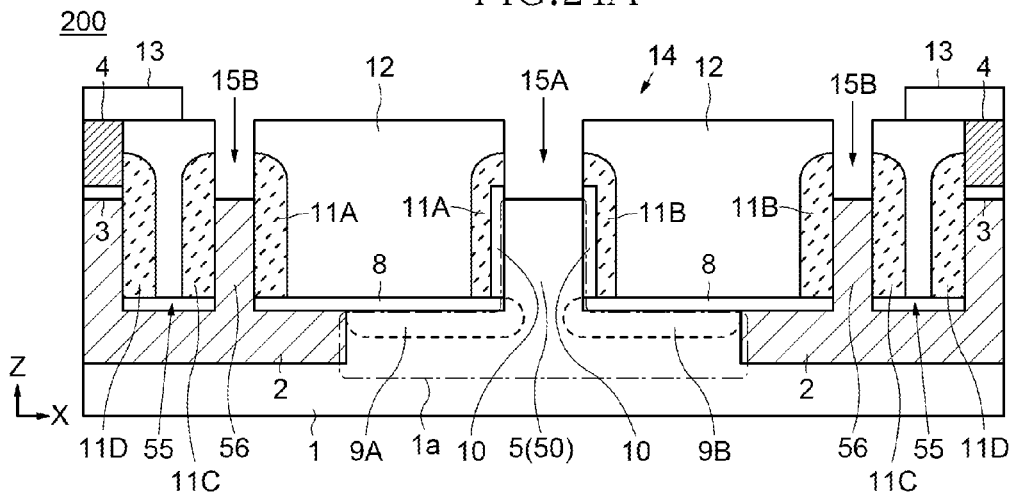
FIG. 24B is a cross-sectional view taken along a line A-A' of FIG. 24A.
Figure 25:
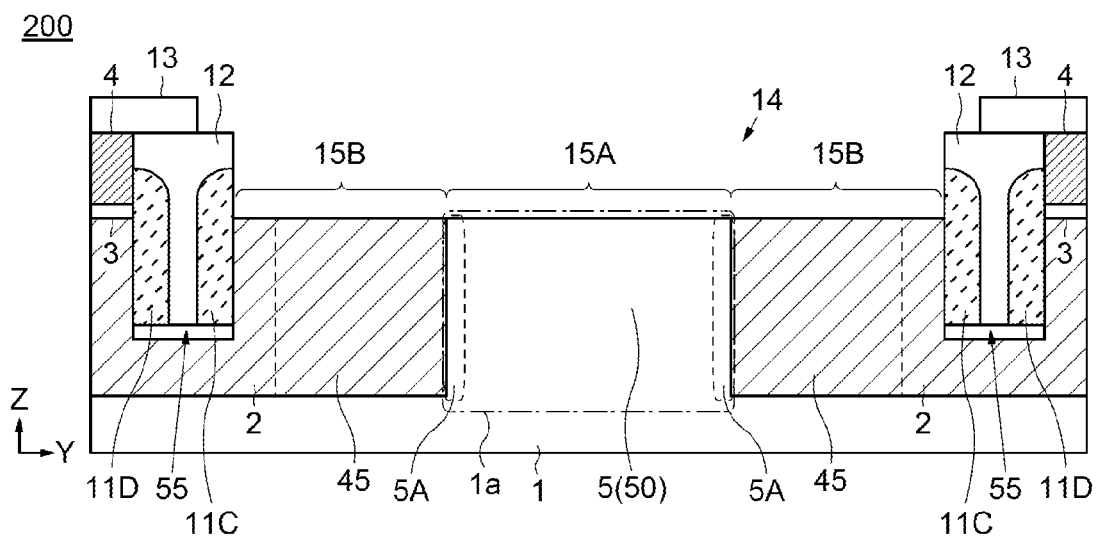
FIG. 25 is a cross-sectional view taken along a line B-B' of FIG. 24A.
Figure 26:
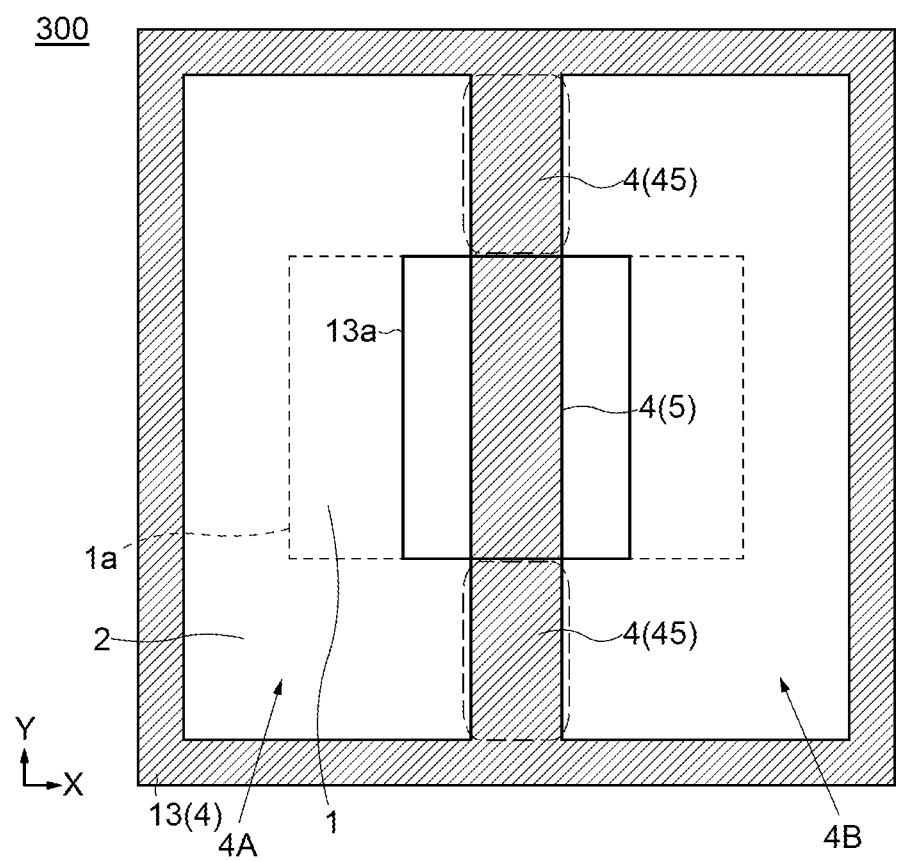
FIG. 26 is a schematic plan view of a semiconductor device before the removal of the mask film according to a related art.
Figure 27:
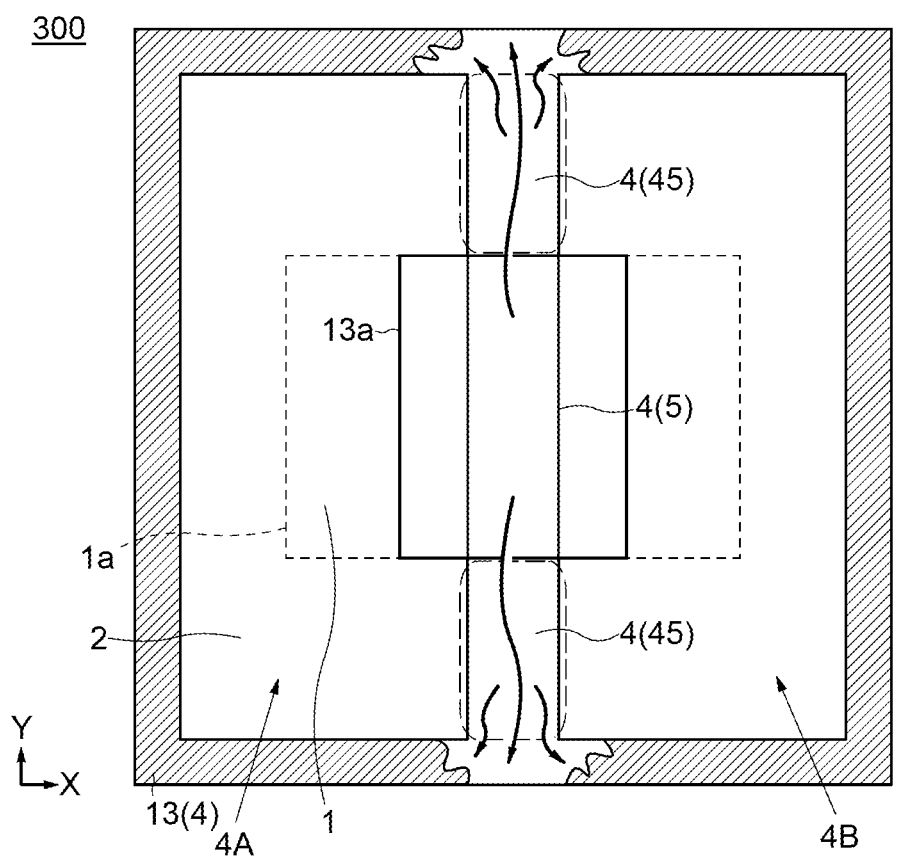
FIG. 27 is a schematic plan view of the semiconductor device after the removal of the mask film according to the related art.

Next, turning to FIGS. 24A, 24B, and 25, a first interlayer insulating film 12 is formed by the fabrication method described in FIGS. 10A and 10B. Next, the first interlayer insulating film 12 is planarized by CMP until the mask film 4 is exposed. Next, a mask film 13 made of a silicon dioxide film is formed with a thickness of 150 nm by CVD.

Next, a part of the mask film 13 is removed by using photolithography and dry etching. The mask film 13 is removed only from where the silicon pillar 5 and the insulating pillars 45 and 56 are arranged. An openings 14 formed by the removal of the mask film 13 expose the mask film 4 above the silicon pillar 5 and the insulating pillars 45 and 56 (see FIGS. 22A and 22B). The bottom of the opening 14 is located at the position of the upper surface of the first interlayer insulating film 12, or silicon dioxide film, filling the groove 55. The mask film 4 to be left on the upper surface of the STI 2 is fully covered with the mask film 13.

Next, the exposed mask film 4 is selectively removed by wet etching. The insulating film 3 is further removed to form openings 15 (15A and 15B) above the silicon pillar 5 and the insulating pillars 45 and 56. The upper surface of the silicon pillar 5 is exposed in the bottom of the opening 15 (15A) above the silicon pillar 5. The upper surface of the STI 2 is exposed in the bottom of the opening 15 (15B) above the insulating pillars 45 and 56. A part of the gate electrodes 11 are exposed from the side surfaces of both the openings 15.

Note that it is only the mask film 4 on the silicon pillar 5 that needs to be removed. The mask film 4 on the silicon pillar 5 is integrated with the mask film 4 on the insulating pillars 45 and 56 in order to extend the gate electrodes 11. To stabilize the amount of the mask film 4 removed, such portions of the mask film 4 are removed all together. More specifically, the integrated mask film 4 on the silicon pillar 5 and the insulating pillars 45 and 56 is surrounded by the first interlayer insulating film 12 filling the groove 55, and thereby isolated from the mask film 4 on the STI 2.

As described above, the first interlayer insulating film 12 is embedded in the groove 55 of closed loop shape. Such a first interlayer insulating film 12 can function as an etching protection wall to prevent the remaining mask film 4 from being corroded by the etching solution. Since not only the STI 2 but also peripheral circuits and other components constituting the semiconductor device 200 are arranged outside the groove 55, the protection of the mask film. 4 above the STI 2 can also prevent the corrosion of the components and avoid a malfunction of the semiconductor device 200.

Next, the insulating film 17, the pillar upper diffusion layer 16, the sidewall film 18, the silicon plug 19, and the second interlayer insulating film 20 are formed by the fabrication method described above. Next, the metal contact plugs 30, 31, and 41 are similarly formed. The metal wiring 33 and 34 and the signal wiring 42 are further formed. This completes the semiconductor device 200 shown in FIGS. 17A, 17B, and 18.

The semiconductor device 200 according to the second embodiment described above provides the following effects.

The groove 55 is formed in the STI 2 so as to surround the silicon pillar 5 for constituting the unit transistor 50, the insulating pillars 45 connected to the silicon pillar 5, and the insulating pillar 56 connected to the insulating pillars 45. The first interlayer insulating film 12 is arranged in the groove 55. In such a configuration, the first interlayer insulating film 12 arranged in the groove 55 functions as a protection wall for preventing the etching solution from flowing out when removing the mask film 4 above the silicon pillar 5 by wet etching. The mask film 5 above and around the STI 2 can thus be reliably maintained to prevent a malfunction of the semiconductor device 200. The second effect described in the first embodiment is also obtained by the present embodiment.

It is apparent that the present invention is not limited to the above embodiments, but may be modified and changed without departing from the scope and spirit of the invention.

For example, the foregoing embodiments have dealt with the cases of using a silicon substrate which is a representative example of a semiconductor substrate. However, other semiconductor substrates may be used.

In addition, while not specifically claimed in the claim section, the applicant reserves the right to include in the claim section of the application at any appropriate time the following devices and methods:

A1. A method for manufacturing a semiconductor device, comprising:

forming a semiconductor pillar in an active region of a semiconductor substrate and an insulating pillar in an element isolation region surrounding the active region, the semiconductor pillar having first and second side surfaces substantially perpendicular to a main surface of the semiconductor substrate and an upper surface substantially parallel to the main surface of the semiconductor substrate, the insulating pillar being in contact with the first side surface of the semiconductor pillar, the upper surface of the semiconductor substrate being covered with a first mask film;

forming a gate electrode that covers the second side surface of the semiconductor pillar with an intervention of a gate insulating film;

forming a first impurity diffusion layer in the active region located below the semiconductor pillar;

forming an interlayer insulating film that covers at least the gate electrode; and exposing the upper surface of the semiconductor pillar by selectively removing the first mask film by wet etching with the first mask film surrounded by an etching protection wall made of a material different from that of the first mask film.

A2. The method for manufacturing a semiconductor device as described in A1, further comprising forming first and second grooves each located in the active region and the element isolation region, whereby the semiconductor pillar and the insulating pillar are sandwiched between the first and second grooves, wherein a part of the interlayer insulating film is embedded in the first and second grooves.

A3. The method for manufacturing a semiconductor device as described in A2, wherein the first mask film covers the upper surface of the semiconductor pillar without covering an upper surface of the insulating pillar, the upper surface of the insulating pillar is higher in position than that of the upper surface of the semiconductor pillar so that a part of side surface of the insulating pillar is in contact with a side surface of the first mask film, and the part of the side surface of the insulating pillar functions as the etching protection wall.

A4. The method for manufacturing a semiconductor device as described in A3, wherein the upper surface of the insulating pillar and an upper surface of the first mask film are substantially coplanar.

A5. The method for manufacturing a semiconductor device as described in A3, wherein the forming the semiconductor pillar and the insulating pillar includes:

forming a second mask film made of the same material as that of the first mask film on an entire surface of the semiconductor substrate on which the first mask film and the element isolation region are formed, selectively removing the semiconductor substrate and the element isolation region by using the second mask film as a mask, thereby forming the semiconductor pillar and the insulating pillar, and removing the second mask film by wet etching, and the removing the second mask film by wet etching also serves as the removing the first mask film by wet etching.

A6. The method for manufacturing a semiconductor device as described in A5, further comprising:

planarizing the interlayer insulating film by CMP and removing the second mask film to expose an upper surface of the first mask film after the interlayer insulating film is embedded in the first groove;

covering, with a third mask film, an area other than where the first mask film covering the upper surface of the semiconductor pillar is formed; and selectively removing only the first mask film covering the upper surface of the semiconductor pillar by wet etching using the third mask film as a mask.

A7. The method for manufacturing a semiconductor device as described in A1, wherein in the removing the first mask film by wet etching, the first mask film covers the upper surface of the semiconductor pillar and an upper surface of the insulating pillar, and the upper surface of the insulating pillar and the upper surface of the semiconductor pillar are substantially coplanar.

A8. The method for manufacturing a semiconductor device as described in A1, wherein the forming the semiconductor pillar and the insulating pillar includes forming first and second grooves each located in the active region and the element isolation region and a third groove having a closed loop shape surrounding the first and second grooves;

the semiconductor pillar is arranged in an area of the active region sandwiched between the first and second grooves;

the insulating pillar includes a first insulating pillar that is arranged in an area of the element isolation region sandwiched between the first and second grooves and a second insulating pillar that is arranged in an area of the element isolation region sandwiched between one of the first and second grooves and the third groove;

the interlayer insulating film is embedded in each of the first, second and third grooves; and the interlayer insulating film embedded in the second groove functions as the etching protection wall.

A9. The method for manufacturing a semiconductor device as described in A8, wherein the forming the semiconductor pillar and the insulating pillar includes:

forming an element isolation insulating film in the element isolation region;

forming the first mask film on the active region of the semiconductor substrate and the element isolation insulating film; and selectively removing the semiconductor substrate and the element isolation insulating film by using the first mask film as a mask, whereby the first, second and third grooves are simultaneously formed.

A10. The method for manufacturing a semiconductor device as described in A1, wherein the first mask film covers the upper surface of the semiconductor pillar and an upper surface of the insulating pillar, the upper surface of the semiconductor pillar and the upper surface of the insulating pillar are substantially coplanar.

A11. The method for manufacturing a semiconductor device as described in A1, wherein the forming the semiconductor pillar and the insulating pillar includes forming first and second grooves each located in the active region and the element isolation region and a third groove having a closed loop shape surrounding the first and second grooves;

the semiconductor pillar is arranged in an area of the active region sandwiched between the first and second grooves;

the insulating pillar includes a first insulating pillar that is arranged in an area of the element isolation region sandwiched between the first and second grooves and a second insulating pillar that is arranged in an area of the element isolation region sandwiched between one of the first and second grooves and the third groove;

the interlayer insulating film is embedded in each of the first, second and third grooves; and the interlayer insulating film embedded in the second groove functions as the etching protection wall.

A12. The method for manufacturing a semiconductor device as described in A11, wherein the forming the semiconductor pillar and the insulating pillar includes:

forming an element isolation insulating film in the element isolation region;

forming the first mask film on the active region of the semiconductor substrate and the element isolation insulating film; and selectively removing the semiconductor substrate and the element isolation insulating film by using the first mask film as a mask, whereby the first, second and third grooves are simultaneously formed.

A13. The method for manufacturing a semiconductor device as described in A1, further comprising forming a second impurity diffusion layer on the upper surface of the semiconductor pillar.

B1. A semiconductor device comprising:

a semiconductor substrate including an active region having a semiconductor pillar, the semiconductor pillar having first and second side surfaces substantially perpendicular to a main surface of the semiconductor substrate;

an element isolation region surrounding the active region, the element isolation region including a first insulating pillar that is in contact with the first side surface of the semiconductor pillar;

a gate electrode that covers the second side surface of the semiconductor pillar with an intervention of a gate insulating film;

a first impurity diffusion layer formed on an upper surface of the semiconductor pillar;

a second impurity diffusion layer formed in the active region located below the semiconductor pillar; and an etching protection wall that is arranged to surround the semiconductor pillar.

B2. The semiconductor device as described in claim B1, wherein an upper surface of the first insulting pillar is higher in position than that of the upper surface of the semiconductor pillar so that a part of side surface of the first insulating pillar is exposed from the semiconductor pillar, and the part of the side surface of the first insulating pillar functions as the etching protection wall.

B3. The semiconductor device as described in claim B1, wherein:

the etching protection wall includes an interlayer insulating film that is embedded in a groove of closed loop shape surrounding the semiconductor pillar and the first insulating pillar, and the upper surface of the semiconductor pillar and an upper surface of the first insulating pillar are substantially coplanar.

B4. The semiconductor device as described in B3, wherein the element isolation region further includes a second insulating pillar, the semiconductor pillar, the first insulating pillar and the second insulating pillar constitute a cylindrical structure having an inner wall and an outer wall; and the gate electrode is formed on the inner wall of the cylindrical structure.

B5. The semiconductor device as described in B4, further comprising:

a signal wiring; and a contact plug connected between the gate electrode and the signal wiring, the contact plug being arranged on the element isolation region.

What is claimed is:

1. A semiconductor device comprising:
a semiconductor substrate including an active region having a semiconductor pillar, the semiconductor pillar having first and second side surfaces substantially perpendicular to a main surface of the semiconductor substrate;
an element isolation region surrounding the active region, the element isolation region including a first insulating pillar that is in contact with the first side surface of the semiconductor pillar;
a gate electrode that covers the second side surface of the semiconductor pillar with an intervention of a gate insulating film;
a first impurity diffusion layer formed on an upper surface of the semiconductor pillar;
a second impurity diffusion layer formed in the active region located below the semiconductor pillar; and
an etching protection wall that is arranged to surround the semiconductor pillar.

2. The semiconductor device as claimed in claim 1, wherein
the etching protection wall includes an interlayer insulating film that is embedded in a groove of closed loop shape surrounding the semiconductor pillar and the first insulating pillar, and
the upper surface of the semiconductor pillar and an upper surface of the first insulating pillar are substantially coplanar.

3. The semiconductor device as claimed in claim 2, wherein
the element isolation region further includes a second insulating pillar,
the semiconductor pillar, the first insulating pillar and the second insulating pillar constitute a cylindrical structure having an inner wall and an outer wall; and
the gate electrode is formed on the inner wall of the cylindrical structure.

4. The semiconductor device as claimed in claim 3, wherein the interlayer insulating film covers the outer wall of the cylindrical structure.

5. The semiconductor device as claimed in claim 4, wherein the element isolation region further includes a third insulating pillar that surrounds the interlayer insulating film.

6. The semiconductor device as claimed in claim 3, further comprising:
a signal wiring; and
a contact plug connected between the gate electrode and the signal wiring, the contact plug being arranged on the element isolation region.

* * * * *